United States Patent
Ikehashi et al.

(10) Patent No.: US 10,541,671 B2
(45) Date of Patent: Jan. 21, 2020

(54) VIBRATION DEVICE

(71) Applicant: KABUSHIKI KAISHA TOSHIBA, Minato-ku, Tokyo (JP)

(72) Inventors: Tamio Ikehashi, Kanagawa (JP); Shunta Maeda, Tokyo (JP); Ryunosuke Gando, Kanagawa (JP); Yasushi Tomizawa, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 144 days.

(21) Appl. No.: 15/705,202

(22) Filed: Sep. 14, 2017

(65) Prior Publication Data

US 2018/0167053 A1    Jun. 14, 2018

(30) Foreign Application Priority Data

Dec. 8, 2016  (JP) ................ 2016-238903

(51) Int. Cl.
  *G01C 19/574*  (2012.01)
  *G01C 19/5733* (2012.01)
  *H03H 9/24*    (2006.01)
  *G01C 19/5621* (2012.01)

(52) U.S. Cl.
  CPC ....... *H03H 9/2468* (2013.01); *G01C 19/5621* (2013.01); *G01C 19/574* (2013.01)

(58) Field of Classification Search
  None
  See application file for complete search history.

(56) References Cited

U.S. PATENT DOCUMENTS

| 8,113,050 B2 * | 2/2012 | Acar .................. G01C 19/574 |
| | | 73/504.04 |
| 8,342,025 B2 | 1/2013 | Coronato et al. |
| 8,347,717 B2 | 1/2013 | Seeger et al. |
| (Continued) | | |

FOREIGN PATENT DOCUMENTS

| JP | 2011-525233 A | 9/2011 |
| JP | 2013-217666 A | 10/2013 |
| (Continued) | | |

OTHER PUBLICATIONS

"Everything about STMicroelectronics' 3-axis digital MEMS gyroscopes", TA0343 Technical Article, STMicroelectronics, Jul. 2011, pp. 1-40.

*Primary Examiner* — Judy Nguyen
*Assistant Examiner* — Ruben C Parco, Jr.
(74) *Attorney, Agent, or Firm* — Foley & Lardner LLP

(57) ABSTRACT

According to one embodiment, a vibration device includes a first movable unit including first and second movable portions arranged in a direction parallel to a first axis and enabled to vibrate in the direction parallel to the first axis, a second movable unit enabled to vibrate in a direction parallel to a second axis perpendicular to the first axis, and a connection unit configured to connect the first and second movable units together, wherein the following relationship is satisfied $$fi > (1 + 1/(2Qa))fa$$

where a resonant frequency of the first movable unit in an in-phase mode is denoted by fi, a resonant frequency of the first movable unit in an anti-phase mode is denoted by fa, and a Q factor of resonance of the first movable unit in the anti-phase mode is denoted by Qa.

13 Claims, 25 Drawing Sheets

(56) References Cited

U.S. PATENT DOCUMENTS

| | | |
|---|---|---|
| 8,459,110 B2 | 6/2013 | Cazzaniga et al. |
| 8,904,866 B2 | 12/2014 | Hammer |
| 8,950,257 B2 | 2/2015 | Cazzaniga et al. |
| 9,052,194 B2 | 6/2015 | Seeger et al. |
| 9,234,913 B2 | 1/2016 | Simoni et al. |
| 9,551,577 B2 | 1/2017 | Ruohio et al. |
| 2005/0081633 A1 | 4/2005 | Nasiri et al. |
| 2005/0082252 A1 | 4/2005 | Nasiri et al. |
| 2005/0170656 A1 | 8/2005 | Nasiri et al. |
| 2006/0219006 A1 | 10/2006 | Nasiri et al. |
| 2008/0115579 A1 | 5/2008 | Seeger et al. |
| 2010/0313657 A1* | 12/2010 | Trusov ............... G01C 19/5719 73/504.16 |
| 2011/0061460 A1 | 3/2011 | Seeger et al. |
| 2011/0154898 A1 | 6/2011 | Cazzaniga et al. |
| 2012/0055248 A1 | 3/2012 | Hammer |
| 2012/0291549 A1 | 11/2012 | Seeger et al. |
| 2013/0125649 A1 | 5/2013 | Simoni et al. |
| 2013/0239679 A1 | 9/2013 | Kornilovich |
| 2013/0283909 A1 | 10/2013 | Furuhata |
| 2014/0047921 A1 | 2/2014 | Seeger et al. |
| 2014/0116135 A1 | 5/2014 | Cazzaniga et al. |
| 2014/0230549 A1 | 8/2014 | McNeil et al. |
| 2014/0245831 A1 | 9/2014 | Furuhata |
| 2014/0260615 A1* | 9/2014 | Simon ............... G01P 15/097 73/514.29 |
| 2015/0000400 A1 | 1/2015 | Cazzaniga et al. |
| 2015/0114112 A1 | 4/2015 | Valzasina et al. |
| 2015/0211854 A1 | 7/2015 | Ruohio et al. |
| 2015/0226558 A1 | 8/2015 | Seeger et al. |
| 2015/0300821 A1 | 10/2015 | Takizawa |
| 2016/0025492 A1 | 1/2016 | Rocchi |
| 2016/0298966 A1 | 10/2016 | Ikehashi |
| 2017/0108335 A1* | 4/2017 | Sakai ............... G01C 19/5656 |

FOREIGN PATENT DOCUMENTS

| | | |
|---|---|---|
| JP | 2014-160070 A | 9/2014 |
| JP | 2014-169934 A | 9/2014 |
| JP | 2015-206710 A | 11/2015 |
| JP | 2016-200512 A | 12/2016 |
| WO | WO-2010/136379 A1 | 12/2010 |

* cited by examiner

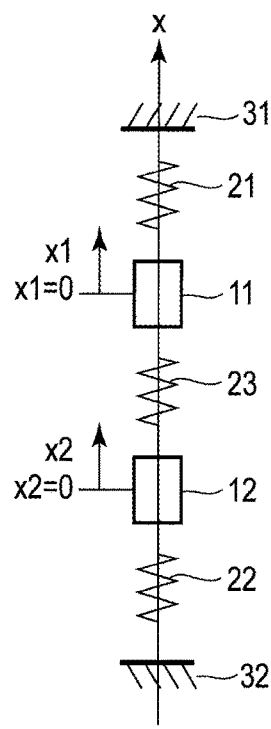
F I G. 1
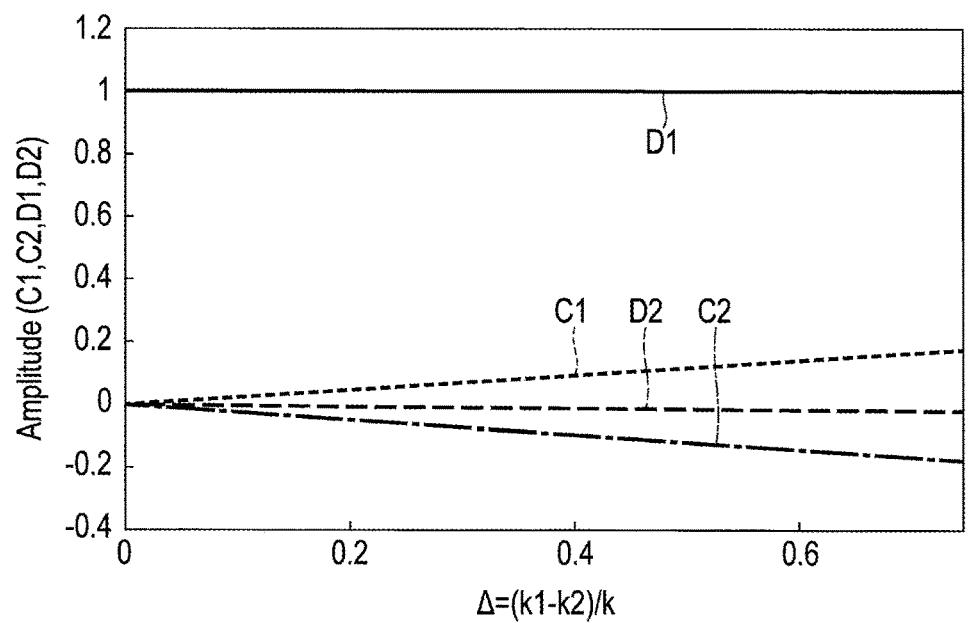
F I G. 2

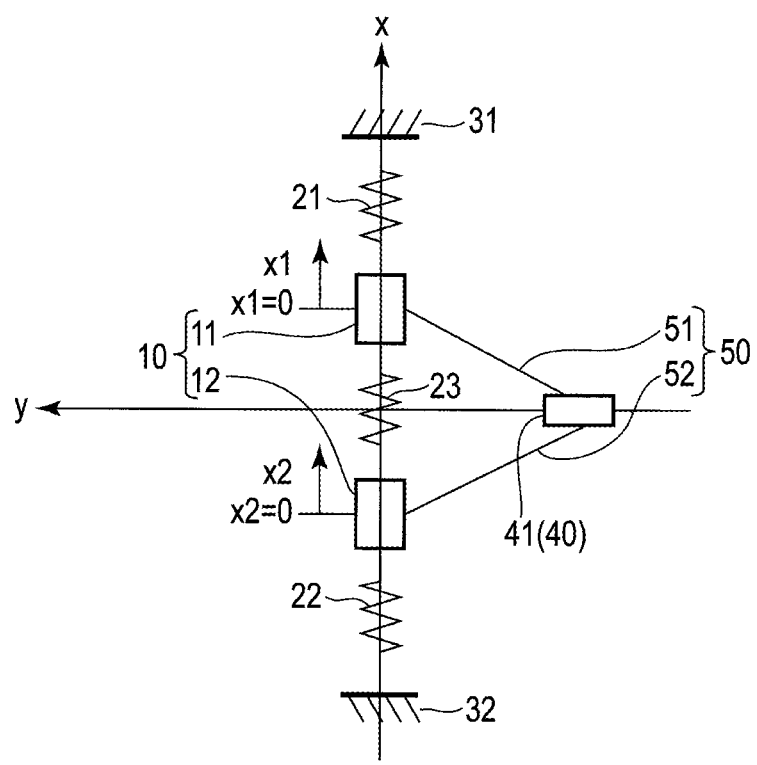
F I G. 3

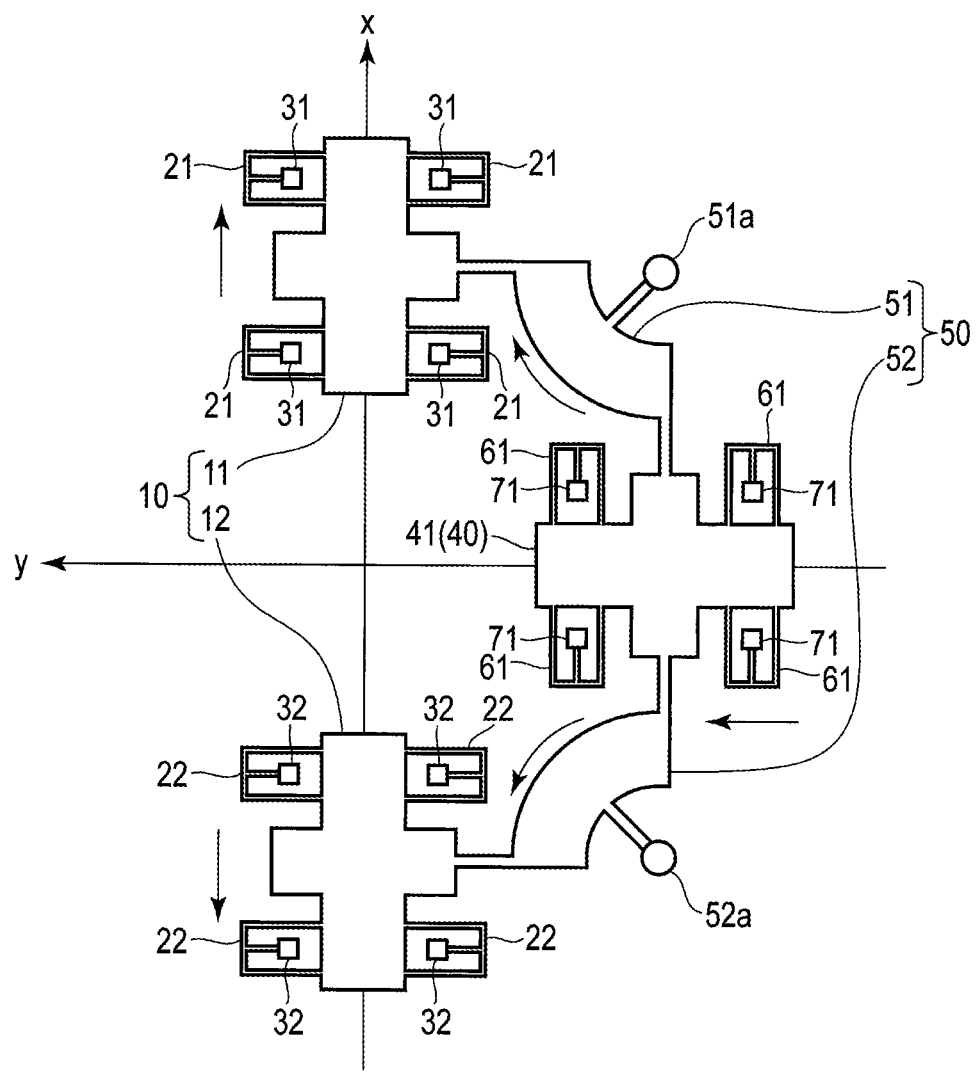
F I G. 6

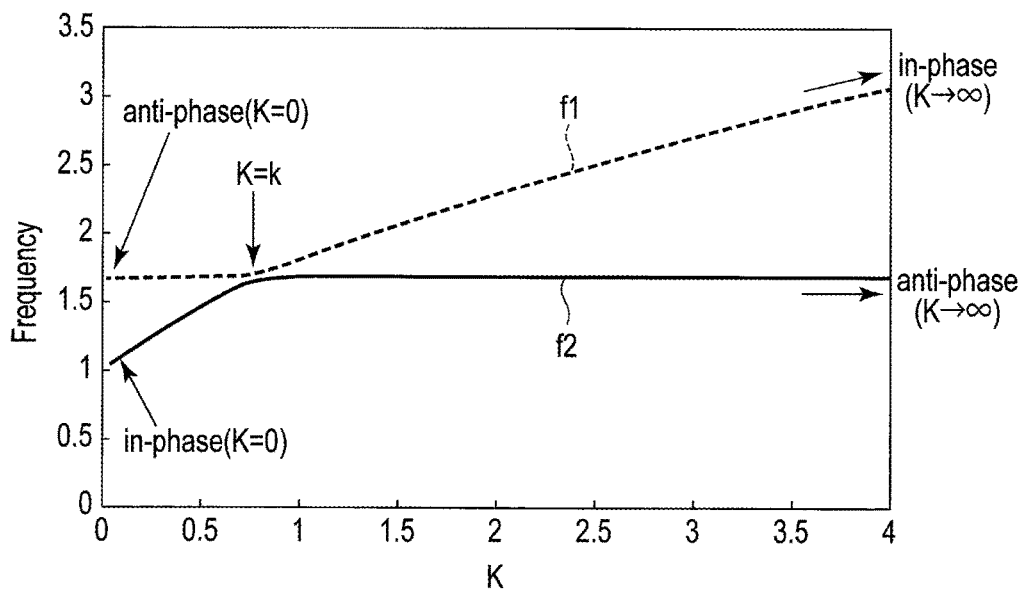
F I G. 7
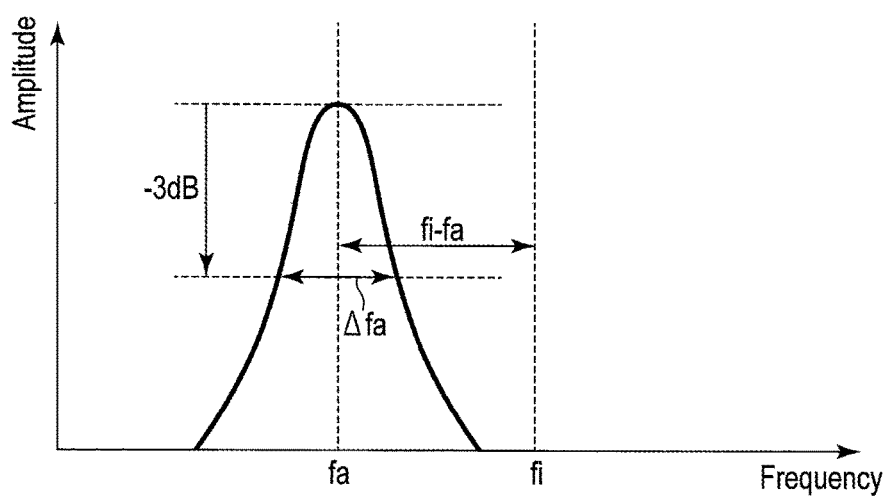
F I G. 8

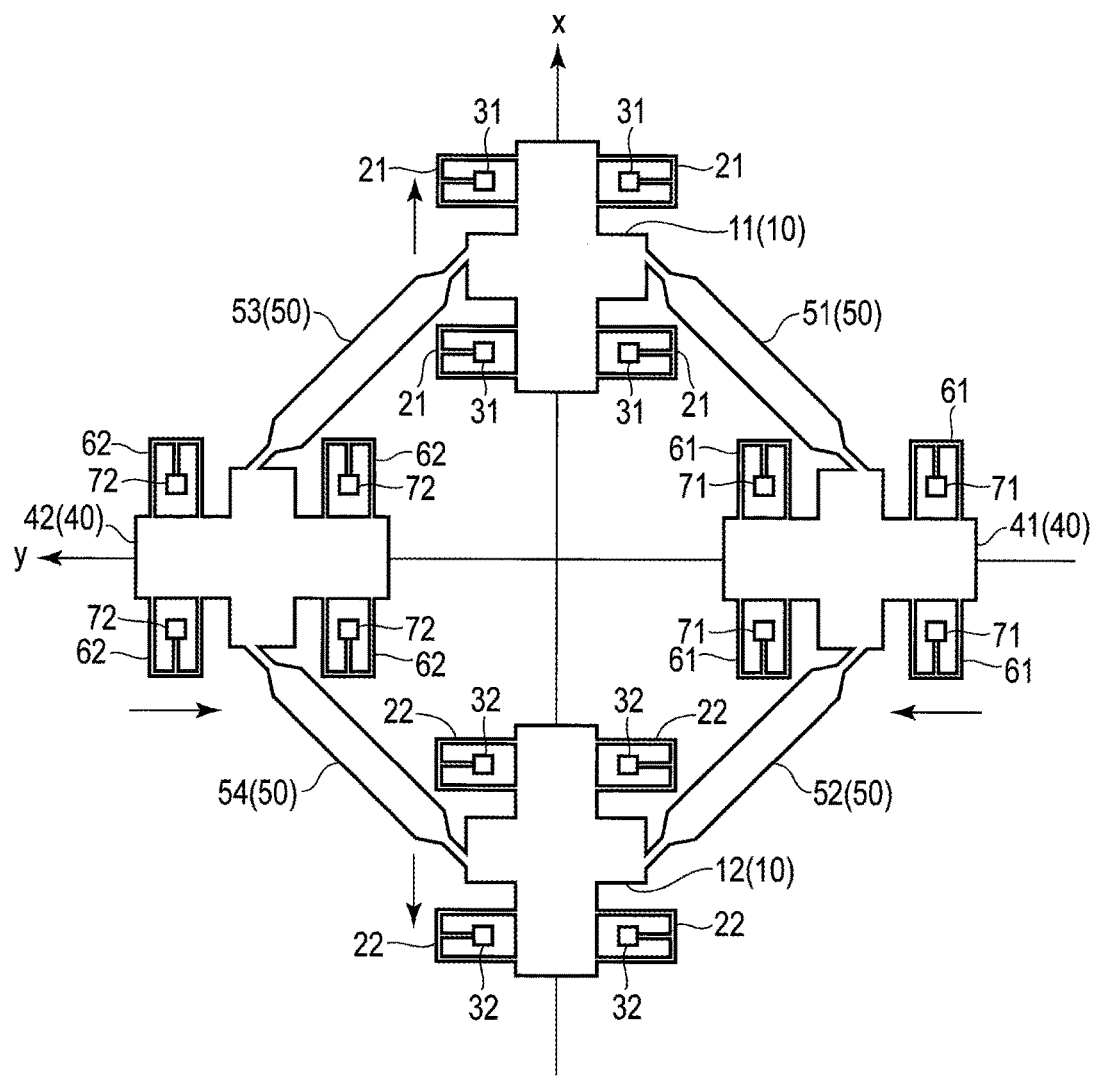
F I G. 10

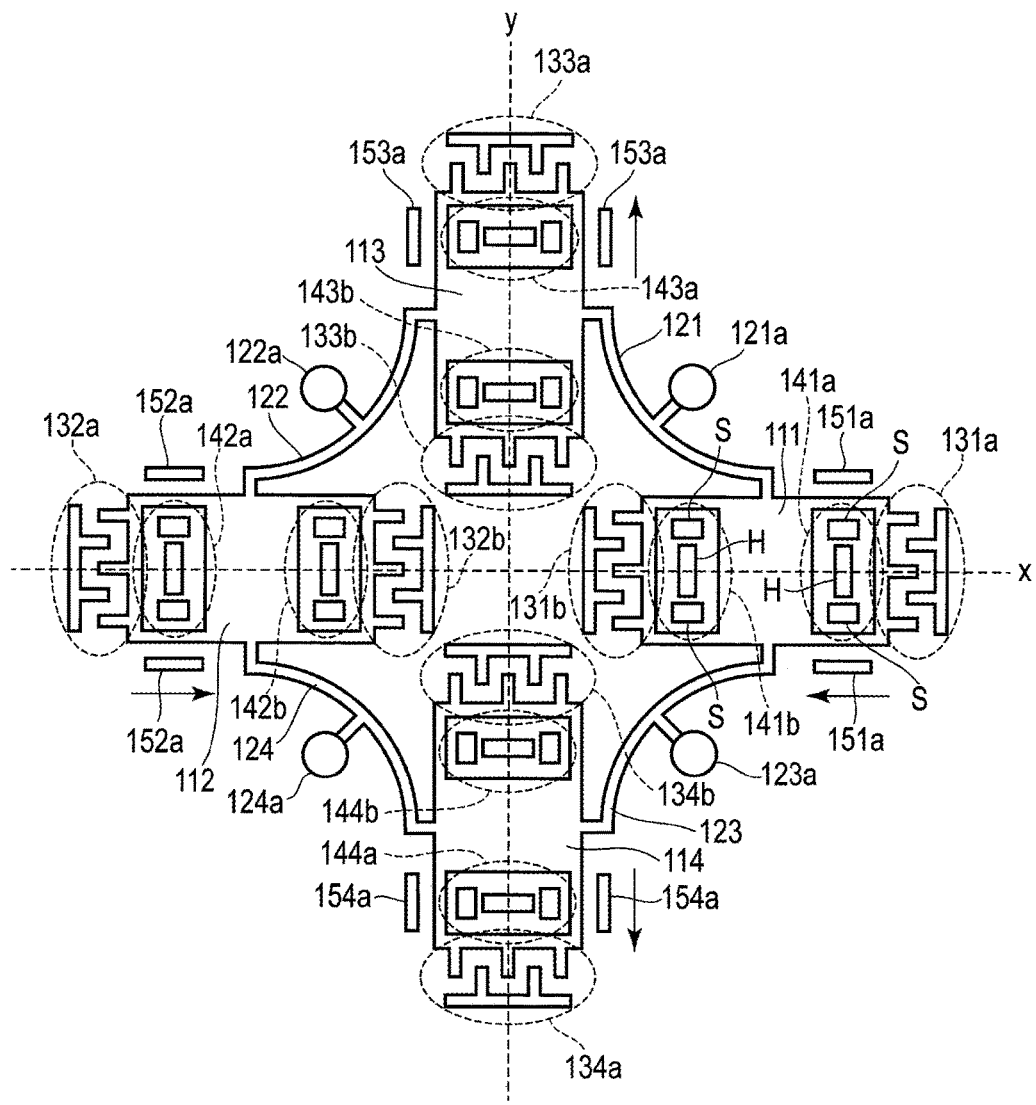
F I G. 11

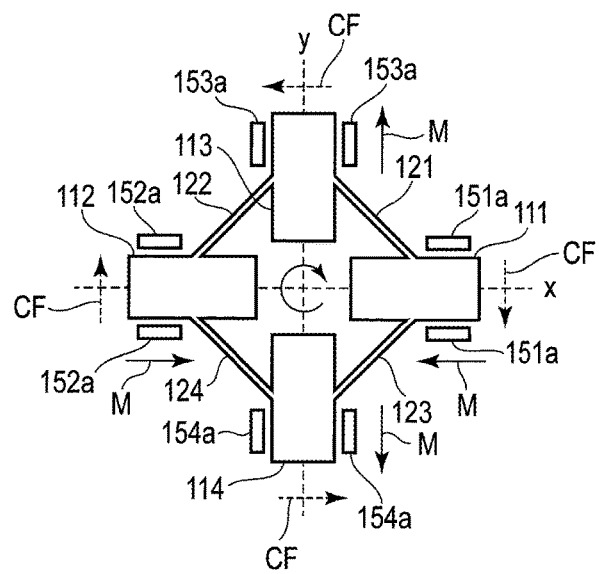
F I G. 16
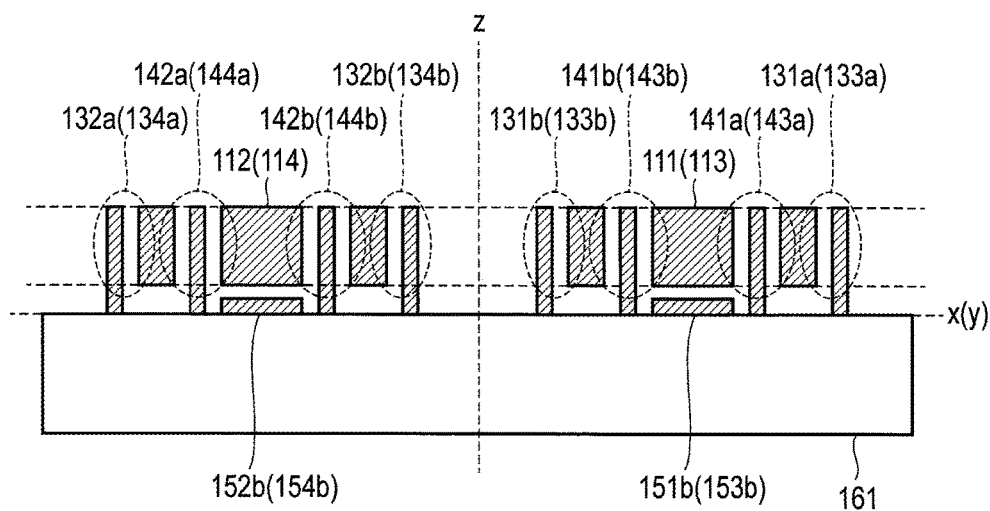
F I G. 17

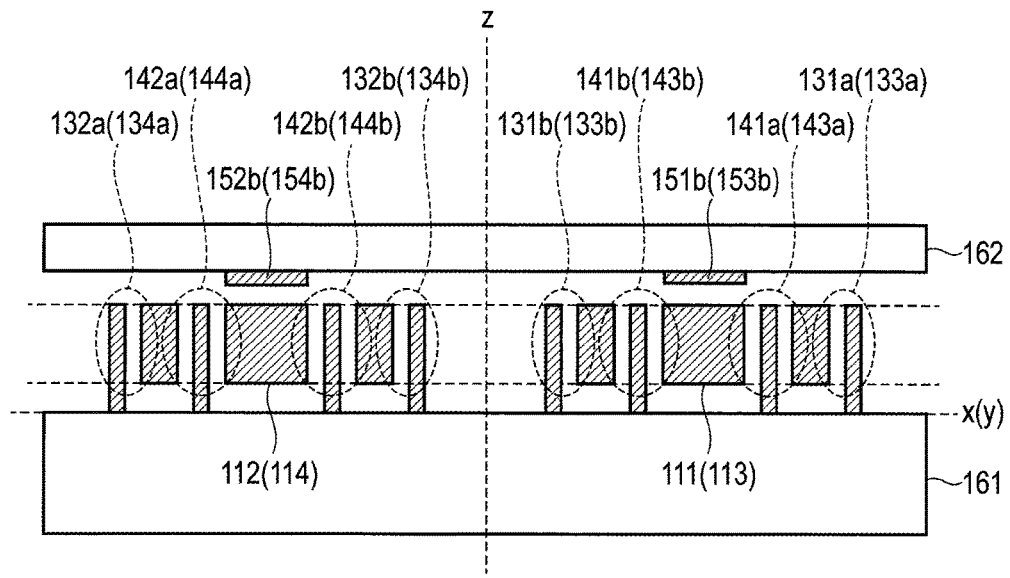
F I G. 18
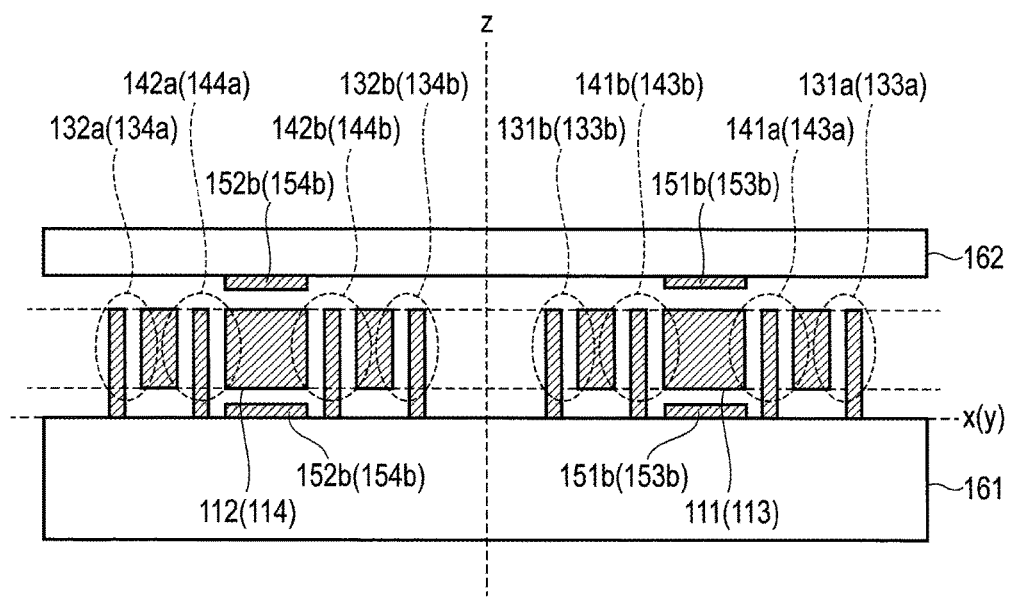
F I G. 19

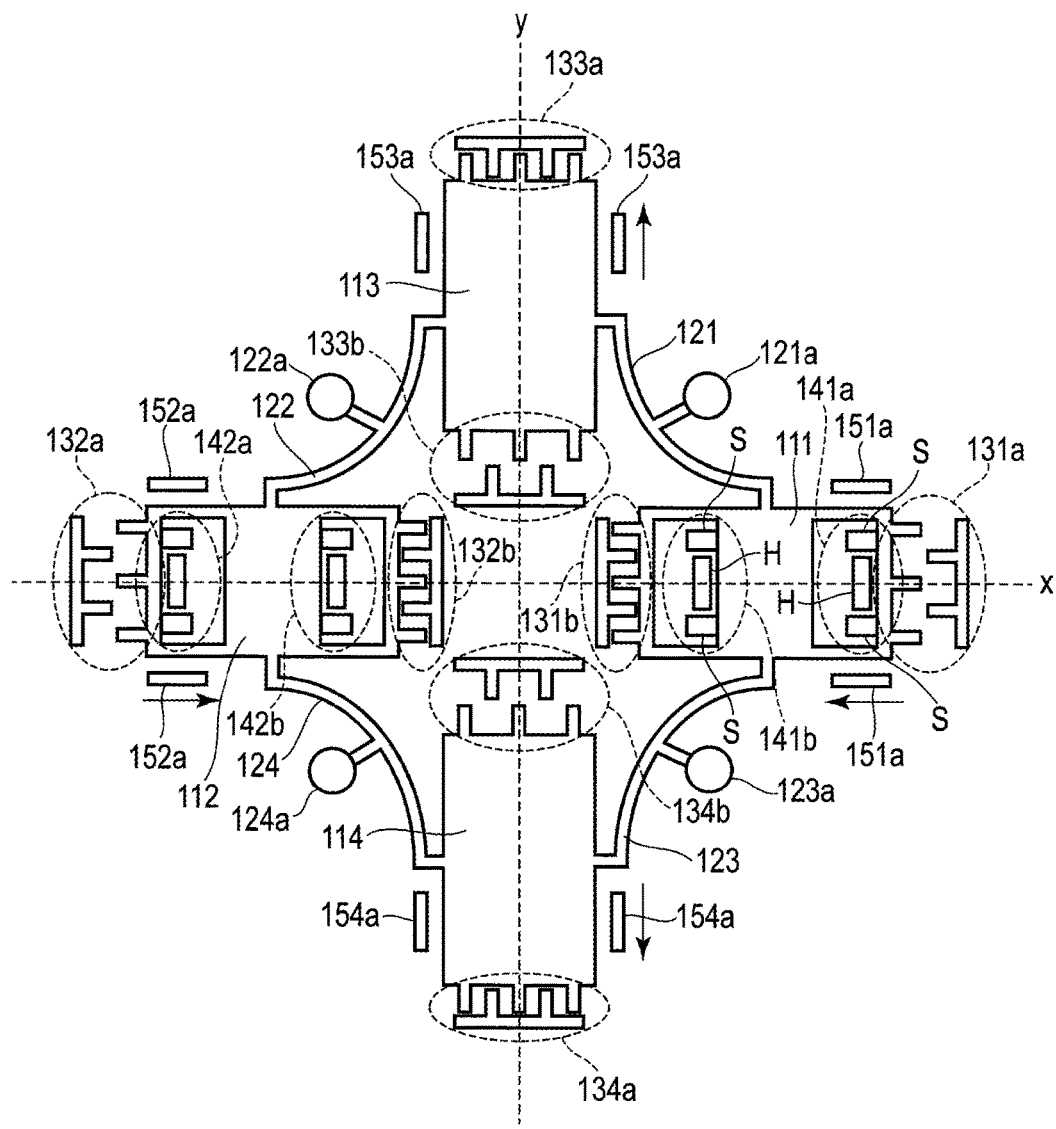
F I G. 20

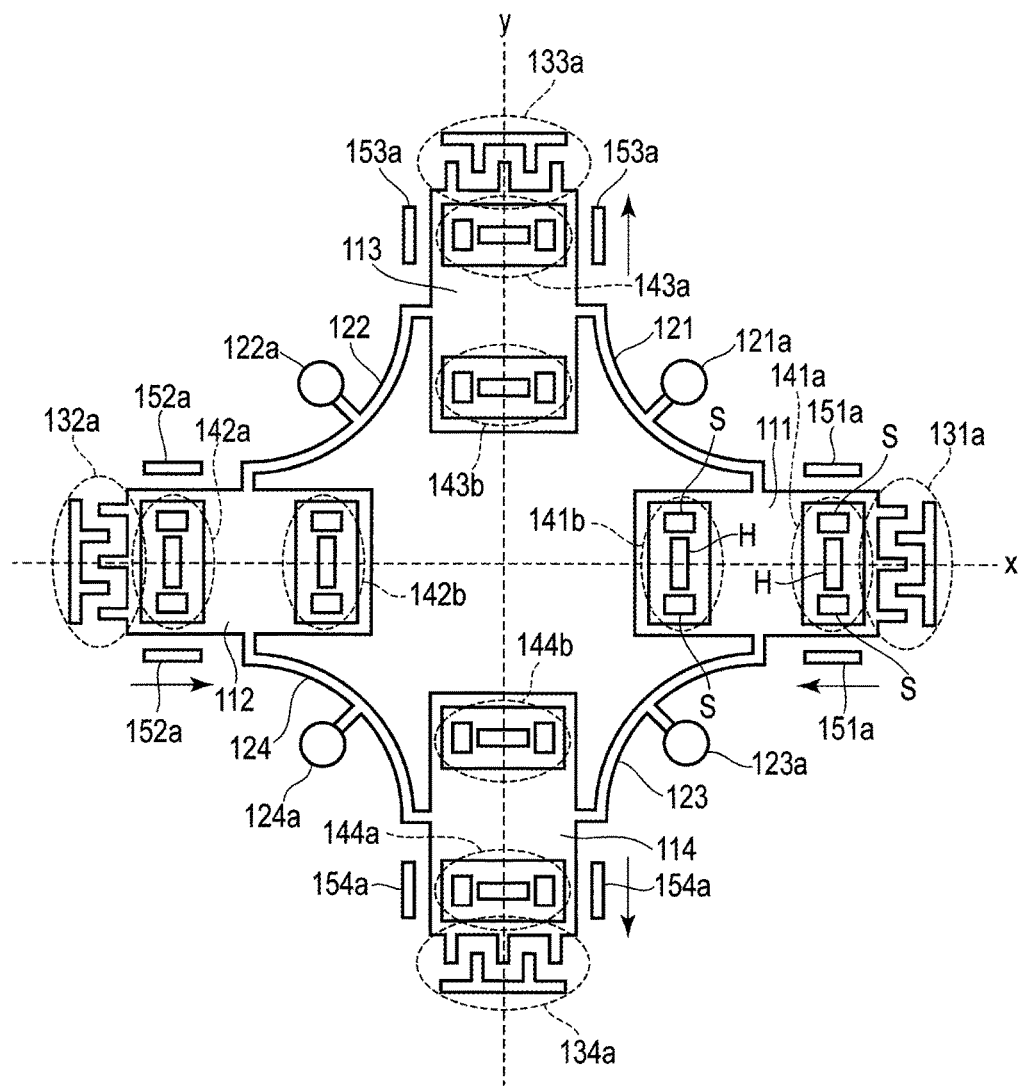
F I G. 21

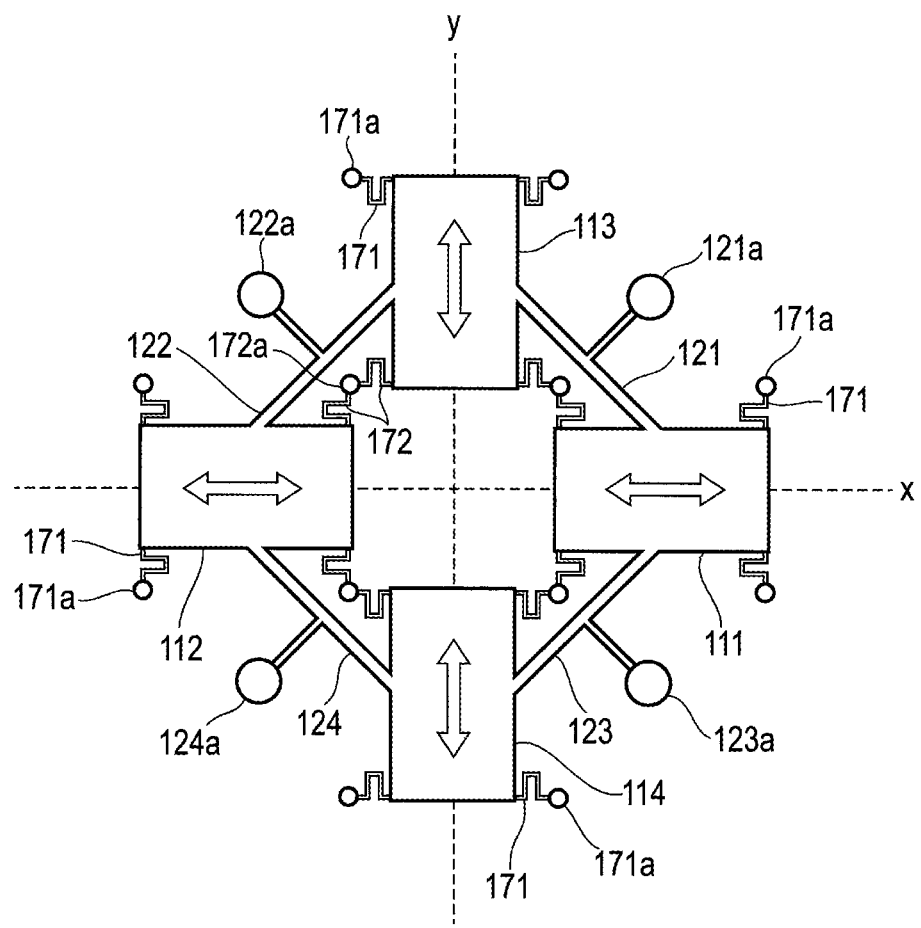
F I G. 22

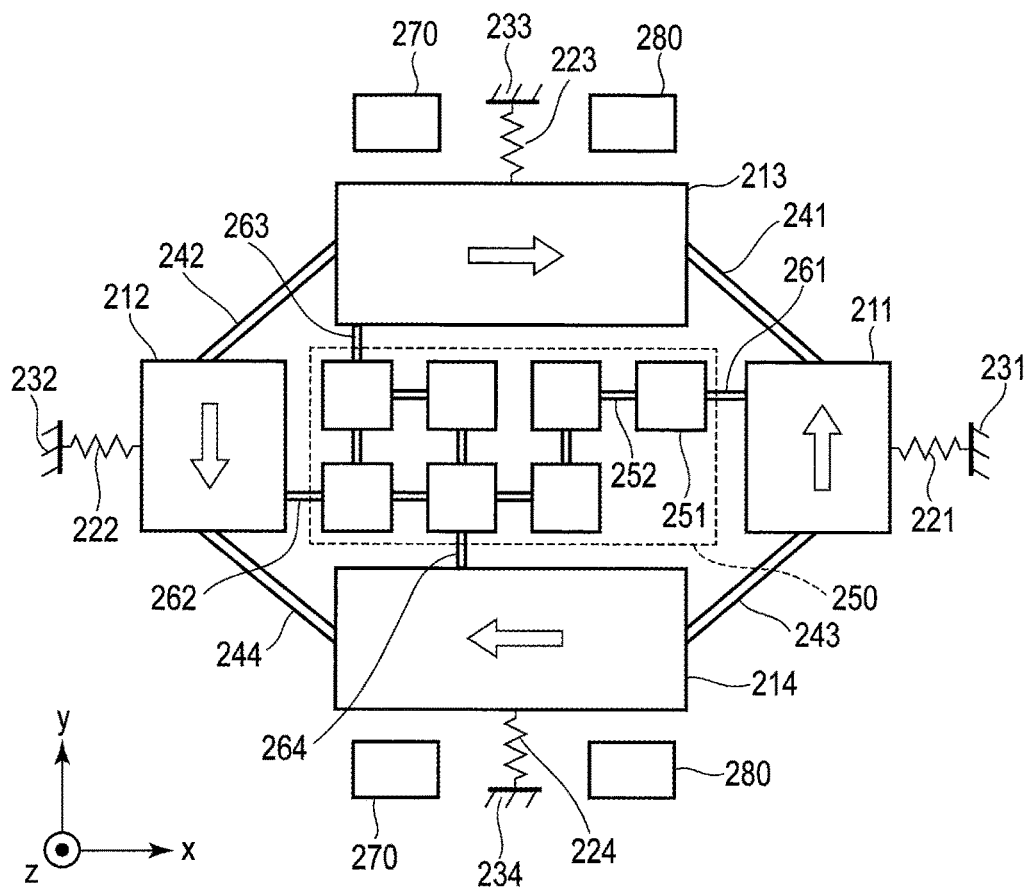
F I G. 25
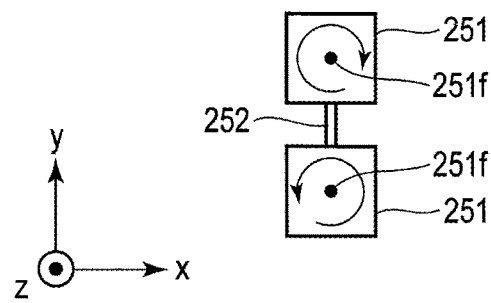
F I G. 26

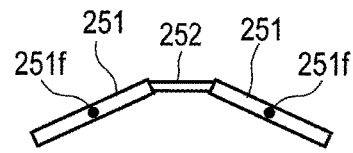
F I G. 27
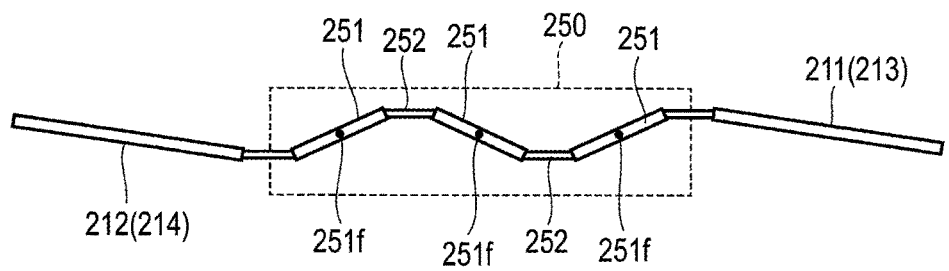
F I G. 28
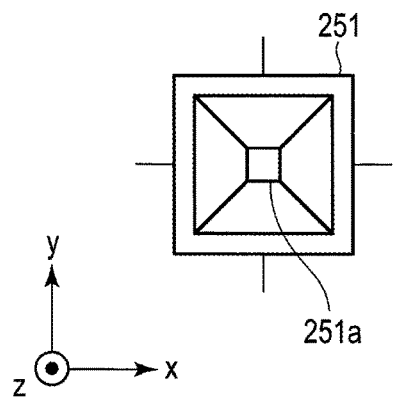
F I G. 29

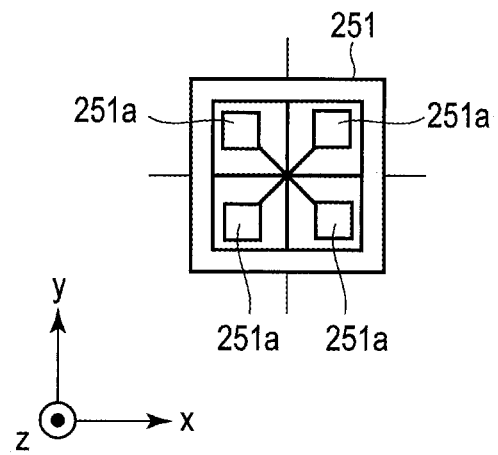
F I G. 30
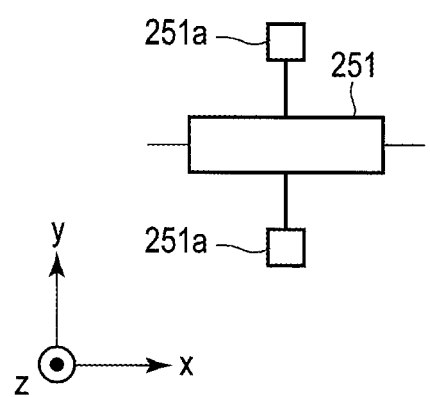
F I G. 31

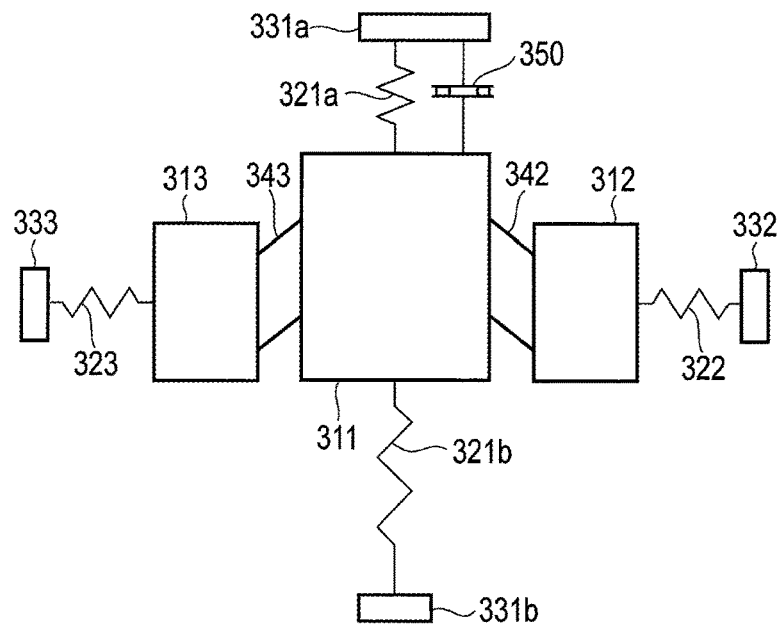
F I G. 33
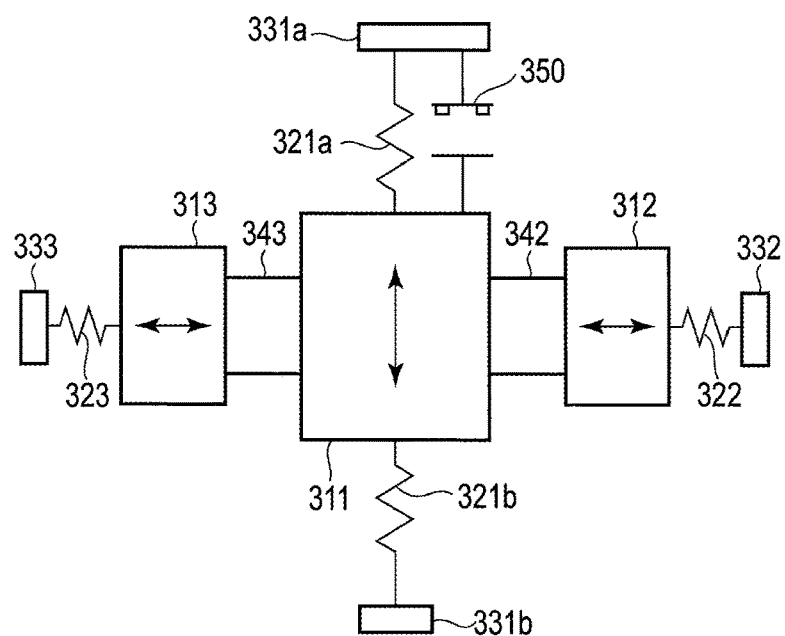
F I G. 34

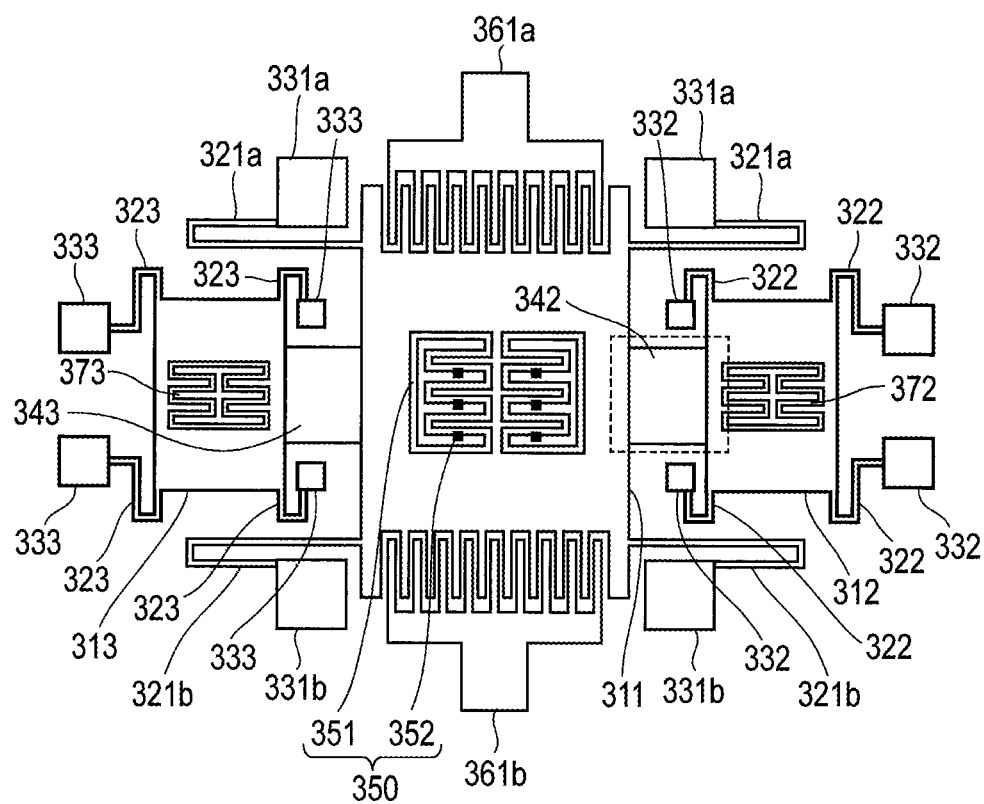
F I G. 35

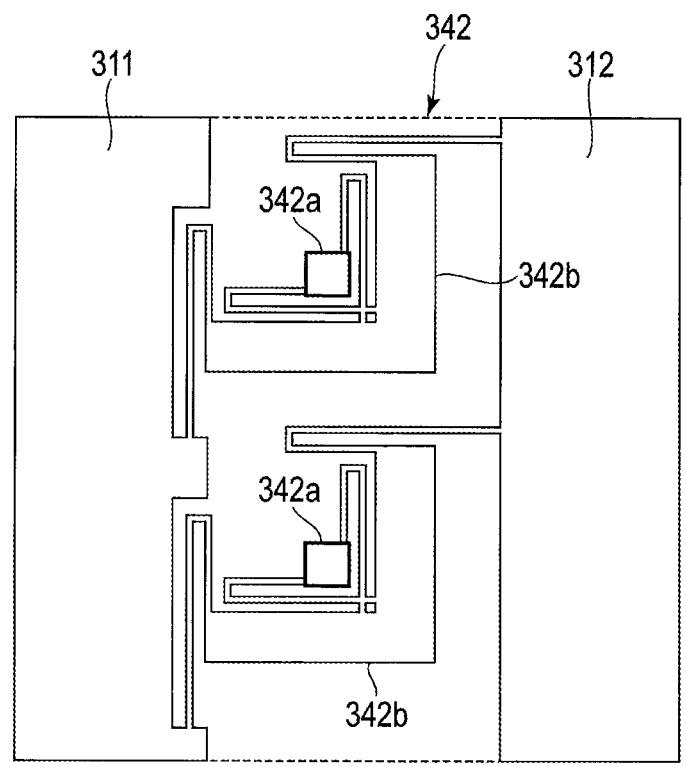
F I G. 36
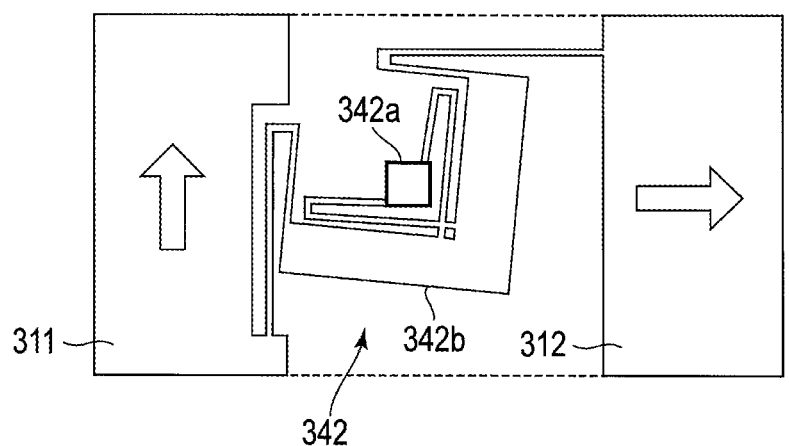
F I G. 37

VIBRATION DEVICE

CROSS-REFERENCE TO RELATED APPLICATIONS

This application is based upon and claims the benefit of priority from Japanese Patent Application No. 2016-238903, filed Dec. 8, 2016, the entire contents of which are incorporated herein by reference.

FIELD

Embodiments described herein relate generally to a vibration device.

BACKGROUND

Known vibration devices used for gyrosensors and the like include a tuning fork mechanism (TF mechanism). In a vibration device comprising the TF mechanism, two mass portions (movable portions) arrayed in the same direction vibrate in an anti-phase mode, thus allowing elimination of adverse effects of translational motion such as acceleration.

A vibration device of a catch and release type (CR type) has also been proposed in which a catch and release mechanism (CR mechanism) is provided for the mass portions (movable portions). The use of the vibration device of the catch and release type enables a drastic reduction in power consumption of the vibration device.

However, when the CR mechanism is adopted for the vibration device comprising the TF mechanism, a vibration component in an in-phase mode is generated in addition to a vibration component in the anti-phase mode particularly in an initial stage of vibration. Therefore, a vibration device has been desired which enables the vibration component in the in-phase mode to be suppressed.

BRIEF DESCRIPTION OF THE DRAWINGS

FIG. 1 is a diagram schematically depicting a conceptual basic configuration of a vibration device with a TF mechanism according to a first embodiment;

FIG. 2 is a diagram illustrating relations between Δ and amplitudes (C1, C2, D1, D2) according to the first embodiment;

FIG. 3 is a diagram schematically depicting the conceptual basic configuration of the vibration device according to the first embodiment;

FIG. 6 is a diagram schematically illustrating a second specific configuration example of the vibration device according to the first embodiment;

FIG. 7 is a diagram illustrating relations between a spring constant K and natural frequencies f1 and f2 according to the first embodiment;

FIG. 8 is a diagram illustrating a frequency property of an amplitude of a movable unit according to the first embodiment;

FIG. 10 is a diagram schematically illustrating a third specific configuration example of the vibration device according to the first embodiment;

FIG. 11 is diagram schematically depicting a configuration of a vibration device according to a second embodiment;

FIG. 16 is a diagram schematically illustrating a detecting operation for the predetermined physical quantity in the vibration device according to the second embodiment;

FIG. 17 is a cross-sectional view schematically depicting a first configuration example of detection units in the vibration device according to the second embodiment;

FIG. 18 is a cross-sectional view schematically depicting a second configuration example of the detection units in the vibration device according to the second embodiment;

FIG. 19 is a cross-sectional view schematically depicting a third configuration example of the detection units in the vibration device according to the second embodiment;

FIG. 20 is a view schematically depicting a configuration of a first modification of the vibration device according to the second embodiment;

FIG. 21 is a view schematically depicting a configuration of a second modification of the vibration device according to the second embodiment;

FIG. 22 is a view schematically depicting a configuration of a third modification of the vibration device according to the second embodiment;

FIG. 25 is a diagram schematically illustrating a conceptual (principle) configuration of a vibration device according to a third embodiment;

FIG. 26 is a diagram schematically illustrating functions of a rotation structure unit and a reverse rotation structure unit in the vibration device according to the third embodiment;

FIG. 27 is a diagram schematically illustrating functions of a rotation structure unit and a reverse rotation structure unit in the vibration device according to the third embodiment;

FIG. 28 is a diagram schematically illustrating operations of the rotation structure unit and the reverse rotation structure unit in the vibration device according to the third embodiment;

FIG. 29 is a diagram schematically depicting an example of a configuration of the rotation structure unit in the vibration device according to the third embodiment;

FIG. 30 is a diagram schematically depicting another example of the configuration of the rotation structure unit in the vibration device according to the third embodiment;

FIG. 31 is a diagram schematically depicting another example of the configuration of the rotation structure unit in the vibration device according to the third embodiment;

FIG. 33 is a diagram schematically illustrating a conceptual (principle) configuration of a vibration device according to a fourth embodiment;

FIG. 34 is a diagram schematically illustrating the conceptual (principle) configuration of the vibration device according to the fourth embodiment;

FIG. 35 is a diagram schematically depicting a configuration of a gyrosensor using the basic principle of the vibration device according to the fourth embodiment;

FIG. 36 is a diagram schematically depicting a specific configuration of a connection unit in the vibration device according to the fourth embodiment; and FIG. 37 is a diagram schematically depicting a state of the connection unit observed when the movable portions are vibrating in the vibration device according to the fourth embodiment.

DETAILED DESCRIPTION

Figure 4:
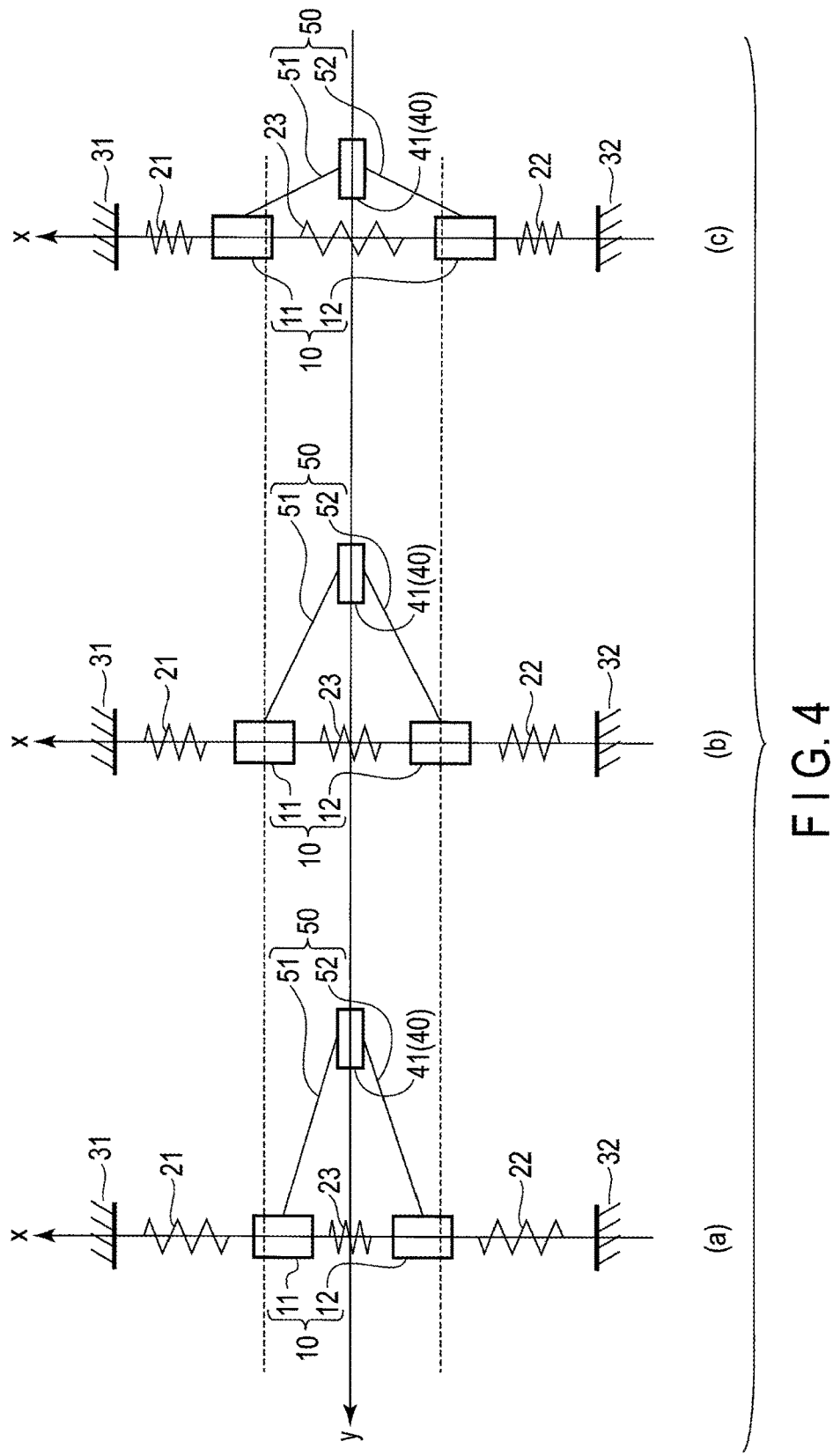
FIG. 4 is a diagram illustrating operations of the vibration device according to the first embodiment.

In general, according to one embodiment, a vibration device includes: a first movable unit including a first movable portion and a second movable portion arranged in a direction parallel to a first axis and enabled to vibrate in the direction parallel to the first axis; a second movable unit enabled to vibrate in a direction parallel to a second axis perpendicular to the first axis; and a connection unit configured to connect the first movable unit and the second movable unit together, wherein the following relationship is satisfied:

$$fi > (1 + 1/(2Qa))fa$$

where a resonant frequency of the first movable unit in an in-phase mode is denoted by fi, a resonant frequency of the first movable unit in an anti-phase mode is denoted by fa, and a Q factor of resonance of the first movable unit in the anti-phase mode is denoted by Qa.

Embodiments will be described below with reference to the drawings.

Embodiment 1

A vibration device according to a first embodiment will be described below. The vibration device according to the present embodiment is used for a gyrosensor comprising a tuning fork mechanism (TF mechanism) and a catch and release mechanism (CR mechanism), and is formed on a semiconductor substrate using a micro electro-mechanical systems (MEMS) technique.

First, basic vibrating operations of a vibration device with a tuning fork mechanism (TF mechanism) will be described below.

FIG. 1 is a diagram schematically depicting a conceptual basic configuration of the vibration device with the TF mechanism.

As depicted in FIG. 1, movable portions (mass portions) 11 and 12 and spring portions 21, 22, and 23 are provided in a direction parallel to an x axis. The movable portions (mass portions) 11 and 12 and the spring portions 21, 22, and 23 are connected together between a fixed portion (fixed end) 31 and a fixed portion (fixed end) 32.

The mass of the movable portion (mass portion) 11 is m1, and the mass of the movable portion (mass portion) 12 is m2. The movable portions 11 and 12 move substantially on the x axis (vibrate on the x axis). Displacement of the movable portion 11 in the x axis direction is denoted by x1, and a positive direction on the x axis is represented as a positive displacement direction. In an equilibrium state where no external force (a voltage or the like described below) is applied to the movable portion 11, the position of the movable portion 11 corresponds to an origin (x1=0). Displacement of the movable portion 12 in the x axis direction is denoted by x2, and the positive direction on the x axis is represented as a positive displacement direction. In an equilibrium state where no external force (a voltage or the like described below) is applied to the movable portion 12, the position of the movable portion 12 corresponds to an origin (x2=0).

The spring portion 21 connects the movable portion 11 to the fixed portion (fixed end) 31 and has a spring constant k1. The spring portion 21 may be formed of a single spring or a plurality of springs. If the spring portion 21 is formed of a single spring, the single spring has the spring constant k1. If the spring portion 21 is formed of a plurality of springs, the springs have the composite spring constant k1. When the displacement of the movable portion 11 is x1, a force $-k1 \times x1$ is exerted on the movable portion 11 by the spring portion 21.

The spring portion 21 connects the movable portion 12 to the fixed portion (fixed end) 32 and has a spring constant k2. The spring portion 22 may be formed of a single spring or a plurality of springs. If the spring portion 22 is formed of a single spring, the single spring has the spring constant k2. If the spring portion 22 is formed of a plurality of springs, the springs have the composite spring constant k2. When the displacement of the movable portion 12 is x2, a force $-k2 \times x2$ is exerted on the movable portion 12 by the spring portion 22.

The spring portion 23 connects the movable portion 11 and the movable portion 12 together and has a spring constant k. The spring portion 23 may be formed of a single spring or a plurality of springs. If the spring portion 23 is formed of a single spring, the single spring has the spring constant k. If the spring portion 23 is formed of a plurality of springs, the springs have the composite spring constant k. When the displacement of the movable portion 11 is x1 and the displacement of the movable portion 12 is x2, a force $-k(x1-x2)$ is exerted on the movable portion 11 by the spring portion 23, and a force $-k(x2-x1)$ is exerted on the movable portion 12 by the spring portion 23. The spring portion 23 may be omitted (k=0).

An equation of motion for the movable portions 11 and 12 is represented as follows:

$$m_1 \ddot{x}_1 = -k_1 x_1 - k(x_1 - x_2)$$

$$m_2 \ddot{x}_2 = -k_2 x_2 - k(x_2 - x_1)$$

The equation of motion has two degrees of freedom and thus has two solutions (natural frequencies f1 and f2). The natural frequencies f1 and f2 are expressed as follows:

$$f_1 = \frac{1}{2\sqrt{2}\pi} \sqrt{(a_1 + a_2 + p_1 + p_2) + r}$$

$$f_2 = \frac{1}{2\sqrt{2}\pi} \sqrt{(a_1 + a_2 + p_1 + p_2) - r}$$

In this case, the following equations hold true.

$$a_1 = \frac{k_1}{m_1}, a_2 = \frac{k_2}{m_2}, p_1 = \frac{k}{m_1}, p_2 = \frac{k}{m_2},$$

$$r = \sqrt{(a_1 - a_2)^2 + (p_1 + p_2)^2 + 2(a_1 - a_2)(p_1 - p_2)}$$

For simplification, m1=m2 and p=k/m are assumed.

In the vibration device with the catch and release mechanism (CR mechanism), to generate an anti-phase mode, initial conditions may be set as follows:

$$x_1(0)=A, x_2(0)=-A$$

$$\ddot{x}_1(0)=0, \ddot{x}_2(0)=0$$

In these equations, an initial displacement is denoted by A.

Coordinates corresponding to an in-phase mode and the anti-phase mode are denoted by Xi and Xa and defined as follows:

$$X_i = \frac{x_1 + x_2}{2}$$

$$X_a = \frac{x_1 - x_2}{2}$$

In this case, solutions for equations of motion meeting the initial conditions are expressed as follows:

$$X_i = A[C_1 \cos(2\pi f_1) + C_2 \cos(2\pi f_2)]$$

$$X_a = A[D_1 \cos(2\pi f_1) + D_2 \cos(2\pi f_2)]$$

In this case, the following equations hold true.

$$C_1 = -C_2 = \frac{\Delta}{4\sqrt{1 + \Delta^2/4}}$$

$$D_1 = \frac{1 + \sqrt{1 + \Delta^2/4}}{2\sqrt{1 + \Delta^2/4}}$$

$$D_2 = \frac{1 - \sqrt{1 + \Delta^2/4}}{2\sqrt{1 + \Delta^2/4}}$$

$$\Delta = \frac{k_1 - k_2}{k}$$

A parameter indicative of the degree of asymmetry between the spring constant k1 of the spring portion 21 and the spring constant k2 of the spring portion 22 is denoted by Δ.

FIG. 2 is a diagram illustrating relations between Δ and amplitudes (C1, C2, D1, D2).

If the spring constant k1 and a spring constant k2 are completely symmetric, Δ=0. In this case, D1=1 and C1=C2=D2=0. Thus, the anti-phase mode with the frequency f1 remains.

However, if the spring constant k1 and the spring constant k2 are asymmetric and Δ>0, the in-phase mode is inevitably mixed even when vibration is started under such initial conditions as generate only the anti-phase mode. In actuality, the asymmetry between the spring constants k1 and k2 inevitably occurs due to a manufacturing variation or the like. If a start timing for vibration varies between the spring portion 21 and the spring portion 22, the in-phase mode is also mixed. As described above, the in-phase mode is inevitably mixed.

The frequency f2 of the in-phase mode is lower than the frequency f1 of the anti-phase mode. This means that the small spring constant makes the in-phase mode likely to involve large displacement. If the value of the spring constant k1 is close to the value of the spring constant k2 and the spring constant k has a small value, r has a small value. As a result, the frequency f1 and the frequency f2 are approximately equal. This means that, even when an attempt is made to generate vibration only with the frequency f1, vibration with the frequency f2 is also likely to occur.

As described above, if the TF mechanism is adopted for the vibration device with the CR mechanism, a vibration component in the in-phase mode is generated in addition to a vibration component in the anti-phase mode. When the vibration component in the in-phase mode is mixed as described above, the adverse effects of translation motion such as acceleration are inhibited from being eliminated. Thus, such a vibration device is adopted for an angular velocity sensor or the like, a high-performance sensor fails to be provided.

In the present embodiment, the above-described problems are solved using the vibration device as described below.

FIG. 3 is a diagram schematically depicting a conceptual basic configuration of the vibration device according to the present embodiment. FIG. 4 is a diagram illustrating operations of the vibration device depicted in FIG. 3.

As depicted in FIG. 3, the first movable unit 10 comprises the first movable portion (mass portion) 11 and the second movable portion (mass portion) 12 which are arrayed in a direction parallel to the x axis (first axis) and which can vibrate in the direction parallel to the x axis (first axis). The first spring portion 21 connects the first movable portion 11 to the first fixed portion (fixed end) 31, and the second spring portion 22 connects the second movable portion 12 to the second fixed portion (fixed end) 32. The spring portion 23 connects the first movable portion 11 and the second movable portion 12 together.

The vibration device in FIG. 3 is provided with a second movable unit 40 which can vibrate in a direction parallel to a y axis (second axis) perpendicular to the x axis (first axis), and a connection unit 50 which connects the first movable unit 10 and the second movable unit 40 together. The second movable unit 40 comprises a third movable portion 41 which can vibrate in a direction parallel to the y axis (second axis).

The connection unit 50 comprises a first connection portion 51 which connects the first movable portion 11 and the third movable portion 41 together and a second connection portion 52 which connects the second movable portion 12 and the third movable portion 41 together.

As described above, the configuration depicted in FIG. 3 is provided with the movable unit 40 (movable portion 41) and the connection unit 50 (connection portion 51 and connection portion 52) in addition to the components depicted in FIG. 1. The connection portion 51 and the connection portion 52 have a composite spring constant K. Provision of the connection portion 51 and the connection portion 52 enables the vibration component in the in-phase mode to be suppressed as described below.

As depicted in FIG. 4, a movable range of the movable portion 41 is limited such that the movable portion 41 vibrates on the y axis (second axis) orthogonal to the x axis (first axis). If the displacement of the movable portion 11 is x1 and the displacement of the movable portion 12 is x2, when "x1+x2≠0", the connection portions 51 and 52 exert a restoring force so as to return to the state of "x1+x2=0". If the movable portions 11 and 12 move with the relation "x1+x2=0" maintained, the connection portions 51 and 52 exerts only a force much weaker than the restoring force on the movable portions 11 and 12. In this way, the force exerted by the connection portions 51 and 52 can be approximately represented as $-K(x_1+x_2)$ using the spring constant K. This force allows a force $-K(x_1+x_2)$ to act on the movable portion 11 and allows a force $-K(x_1+x_2)$ to act on the movable portion 12. A very large spring constant K limits the movable range of the movable portions 11 and 12 substantially to a range satisfying a relation "$x_1+x_2=0$".

Figure 5:
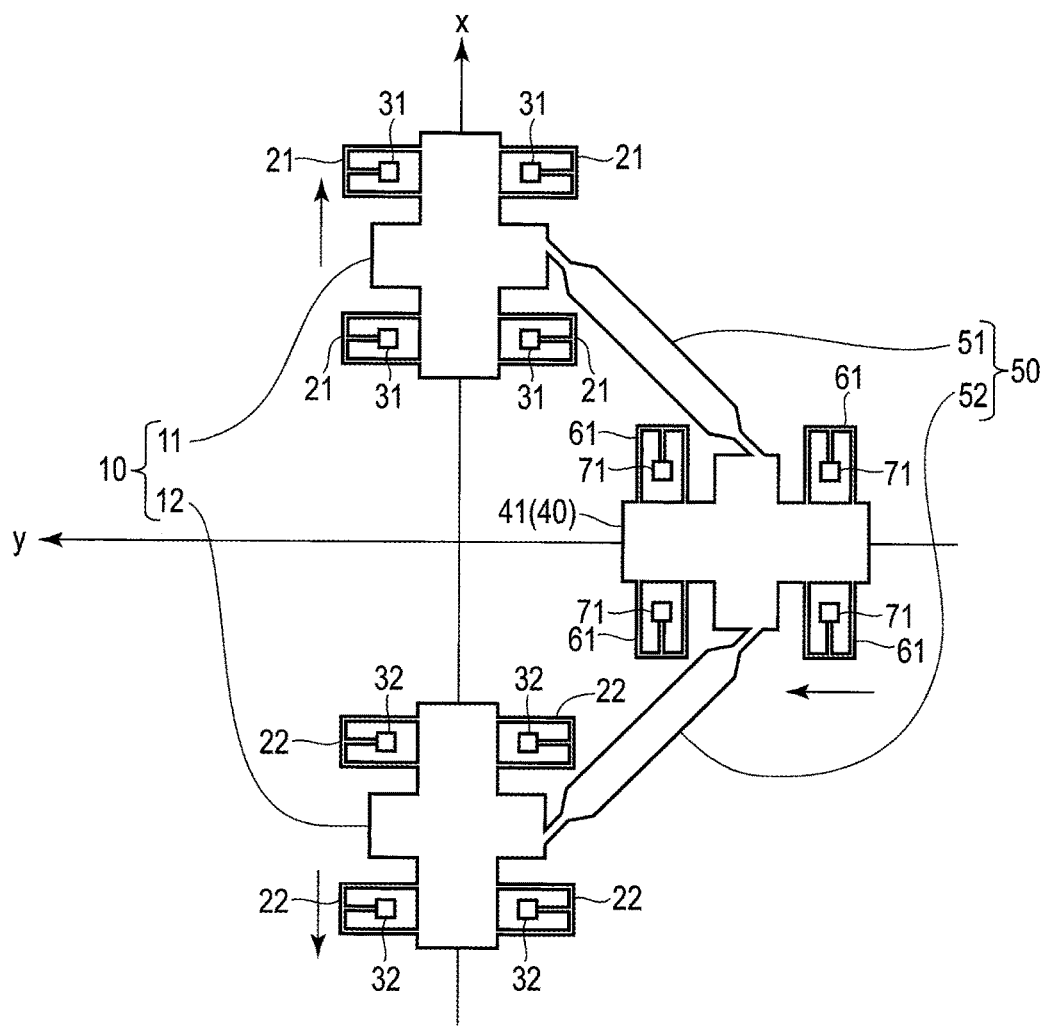
FIG. 5 is a diagram schematically illustrating a first specific configuration example of the vibration device according to the first embodiment.

FIG. 5 is a diagram schematically illustrating a first specific configuration example of the vibration device according to the present embodiment, particularly a first specific configuration example of the connection portions 51 and 52. The basic configuration in FIG. 5 is similar to the configuration depicted in FIG. 3. Therefore, components in FIG. 5 corresponding to the components depicted in FIG. 3 are denoted by the same reference numerals and detailed description of these components is omitted.

As depicted in FIG. 5, the first movable unit 10 comprises the first movable portion (mass portion) 11 and the second movable portion (mass portion) 12. The first fixed portion 31 comprises four anchors. The second fixed portion 32 also comprises four anchors. The first spring portion 21 comprises four springs. The second spring portion 22 comprises four springs. The first spring portion 21 connects the first movable portion 11 to the first fixed portion 31. The second spring portion 22 connects the second movable portion 12 to the first fixed portion 32.

The second movable unit 40 comprises the third movable portion 41. The third movable portion 41 may have the same configuration as that of the first movable portion 11 and the second movable portion 12 or may have a configuration different from the configuration of the first movable portion 11 and the second movable portion 12. The connection unit 50 comprises the first connection portion 51 which connects the first movable portion 11 and the third movable portion 41 together and the second connection portion 52 which connects the second movable portion 12 and the third movable portion 41 together.

The vibration device depicted in FIG. 5 is provided with a third fixed portion 71 and a third spring portion 61 which connects the third movable portion 41 to the third fixed portion 71. The third spring portion 61 comprises four springs, and the third fixed portion 71 comprises four anchors.

In the first specific configuration example depicted in FIG. 5, the connection portion 51 connects the movable portion 11 and the movable portion 41 together, and the connection portion 52 connects the movable portion 12 and the movable portion 41 together. The connection portion 51 and the connection portion 52 have the same structure. The connection portion 51 and the connection portion 52 each have an invariable length. Consequently, since the connection portion 51 and the connection portion 52 each have an invariable length, the movable portion 41 vibrates in the y axis direction according to vibration of the movable portions 11 and 12 in the x axis direction, enabling such operations as illustrated in FIG. 4 to be effectively achieved. To be kept constant in length, each of the connection portions 51 and 52 is made thicker at a central portion thereof as depicted in FIG. 5.

FIG. 6 is a diagram schematically illustrating a second specific configuration example of the vibration device according to the present embodiment, particularly a second specific configuration example of the connection portions 51 and 52. The basic configuration in FIG. 6 is similar to the configuration depicted in FIG. 3, and components in FIG. 6 corresponding to the components depicted in FIG. 3 are denoted by the same reference numerals. Components in FIG. 6 corresponding to the components of the first specific configuration example depicted in FIG. 5 are denoted by the same reference numerals and detailed description of these components is omitted.

In a second specific configuration example depicted in FIG. 6, the first connection portion 51 and the second connection portion 52 are configured to be rotatable around the respective supports. Specifically, the connection portion 51 is rotatable around an anchor 51*a*, and the connection portion 52 is rotatable around an anchor 52*a*. This configuration, like the first specific configuration example, enables such operations as illustrated in FIG. 4 to be effectively achieved.

When the movable portion 41, the connection portions 51, and the connection portion 52 as depicted in FIG. 3 to FIG. 6, equations of motion for the movable portions 11 and 12 are expressed as follows:

$$m_1\ddot{x}_1 = -k_1 x_1 - k(x_1 - x_2) - K(x_1 + x_2)$$

$$m_2\ddot{x}_2 = -k_2 x_2 - k(x_2 - x_1) - K(x_1 + x_2)$$

Two natural frequencies f1 and f2 in these simultaneous equations are expressed as follows:

$$f_1 = \frac{1}{2\sqrt{2}\,\pi}\sqrt{(a_1 + a_2 + p_1 + p_2 + K_1 + K_2) + r_K}$$

$$f_2 = \frac{1}{2\sqrt{2}\,\pi}\sqrt{(a_1 + a_2 + p_1 + p_2 + K_1 + K_2) - r_K}$$

In this case, the following equations hold true.

$$a_1 = \frac{k_1}{m_1},\; a_2 = \frac{k_2}{m_2},\; p_1 = \frac{k}{m_1},\; p_2 = \frac{k}{m_2},\; K_1 = \frac{K}{m_1},\; K_2 = \frac{K}{m_2}$$

$$r_K = \sqrt{(a_1 - a_2)^2 + (p_1 + p_2)^2 + 2(a_1 - a_2)(p_1 - p_2) + \rho_K}$$

$$\rho_K = (K_1 + K_2)^2 + 2(a_1 - a_2)(K_1 - K_2) +$$
$$2(p_1 - p_2)(K_1 - K_2) - 4K_2 p_1 - 4K_1 p_2$$

A case will be described where m1=m2, k1=k2, and K is sufficiently small.

When natural vibration modes corresponding to the natural frequencies f1 and f2 are denoted by X1 and X2, X1 and X2 can be expressed as follows. The anti-phase mode is denoted by X1, and the in-phase mode is denoted by X2.

$$\begin{pmatrix} X_1 \\ X_2 \end{pmatrix} = \begin{pmatrix} \dfrac{-x_1 + x_2}{2} \\ \dfrac{x_1 + x_2}{2} \end{pmatrix}$$

The natural frequencies f1 and f2 can also expressed as follows:

$$f_1 = \frac{1}{2\pi}\sqrt{a_1 + 2p_1}$$

$$f_2 = \frac{1}{2\pi}\sqrt{a_1}$$

In this case, the in-phase mode involves lower frequencies. Results in this case are as described above.

Now, a case will be described where m1=m2 and K is sufficiently large.

When the natural vibration modes corresponding to the natural frequencies f1 and f2 are denoted by X1 and X2, X1 and X2 can be expressed as follows. The in-phase mode is denoted by X1, and the anti-phase mode is denoted by X2.

$$\begin{pmatrix} X_1 \\ X_2 \end{pmatrix} = \begin{pmatrix} \frac{x_1 + x_2}{2} \\ \frac{-x_1 + x_2}{2} \end{pmatrix}$$

The natural frequencies f1 and f2 can also expressed as follows:

$$f_1 = \frac{1}{2\sqrt{2}\pi}\sqrt{a_1 + a_2 + 2p_1 + 4K_1}$$

$$f_2 = \frac{1}{2\sqrt{2}\pi}\sqrt{a_1 + a_2 + 2p_1}$$

In this case, the anti-phase mode involves lower frequencies. While f2 is constant regardless of the value of K, f1 increases consistently with the value of K.

FIG. 7 is a diagram illustrating relations between K and the natural frequencies f1 and f2 observed when m1=m2. The axis of ordinate indicates a ratio with respect to a unit frequency, and the axis of abscissas indicates a ratio with respect to a unit spring constant.

When K is smaller than k, the natural frequency mode corresponding to f1 is substantially the anti-phase mode, and the natural frequency mode corresponding to f2 is substantially the in-phase mode. Furthermore, f2<f1. The substantial anti-phase mode and the substantial in-phase mode mean that a complete anti-phase mode and a complete in-phase mode are achieved at the utmost limit of K→0.

If K is larger than k, the natural frequency mode corresponding to f1 is substantially the in-phase mode, and the natural frequency mode corresponding to f2 is substantially the anti-phase mode. Furthermore, f2<f1. The substantial anti-phase mode and the substantial in-phase mode mean that a complete anti-phase mode and a complete in-phase mode are achieved at the utmost limit of K→∞.

When K is increased while K>k, f2 is substantially constant, whereas f1 increases consistently with K. This means that the in-phase mode involves a large spring constant and is thus suppressed.

As described above, the spring constant (composite spring constant) K for the connection portions 51 and 52 may be increased in order to suppress the in-phase mode in the vibration device comprising the CR mechanism and the TF mechanism.

Now, the degree at which the spring constant (composite spring constant) K for the connection portions 51 and 52 is increased will be described.

To be suppressed, the in-phase mode needs to have a higher resonant frequency than the anti-phase mode. As described above, K>k (condition 1) is needed in order to meet this condition.

Furthermore, when the resonant frequency of the movable unit 10 in the in-phase mode is denoted by fi, the resonant frequency of the movable unit 10 in the anti-phase mode is denoted by fa, and a Q factor of the resonance of the movable unit 10 in the anti-phase mode is denoted by Qa, the following relation (condition 2) needs to be met.

$fi>(1+1/(2Qa))fa$

This will be described below.

FIG. 8 is a diagram illustrating a frequency property of the amplitude of the movable unit 10 (movable portions 11 and 12). The axis of abscissas indicates frequency, and the axis of ordinate indicates amplitude.

To substantially inhibit generation of a vibration component in the in-phase mode when the movable unit 10 is vibrated in the anti-phase mode, the resonant frequency fi in the in-phase mode, the resonant frequency fa in the anti-phase mode, and a half width Δfa of the frequency property of the amplitude in the anti-phase mode need to meet the following relation.

$fi>fa+\Delta fa/2$

The relation between Δfa and Qa is "Qa=fa/Δfa". Therefore, the expression illustrated above is represented as follows.

$fi>fa+\Delta fa/2=(1+1/(2Qa))fa$

The spring constant (composite spring constant) K for the connection portions 51 and 52 may be increased to the degree that the above-described relational expressions hold true. When the relational expressions illustrated above are represented using the above-described parameters, the following relation holds true.

$$\sqrt{(a_1 + a_2 + p_1 + p_2 + K_1 + K_2) + r_K} > \left(1 + \frac{1}{2Q_a}\right)\sqrt{(a_1 + a_2 + p_1 + p_2 + K_1 + K_2) - r_K}$$

If the vibration device of the present embodiment is used as a gyrosensor, when the resonant frequency of sense vibration of the movable unit 10 for allowing detection of a Coriolis force applied to the movable unit 10 and a Q factor of resonance of the sense vibration are denoted by fs and Qs, respectively, the following relation (condition 3) needs to be met.

$fi>(1+1/(2Qs))fs$

This will be described below.

Figure 9:
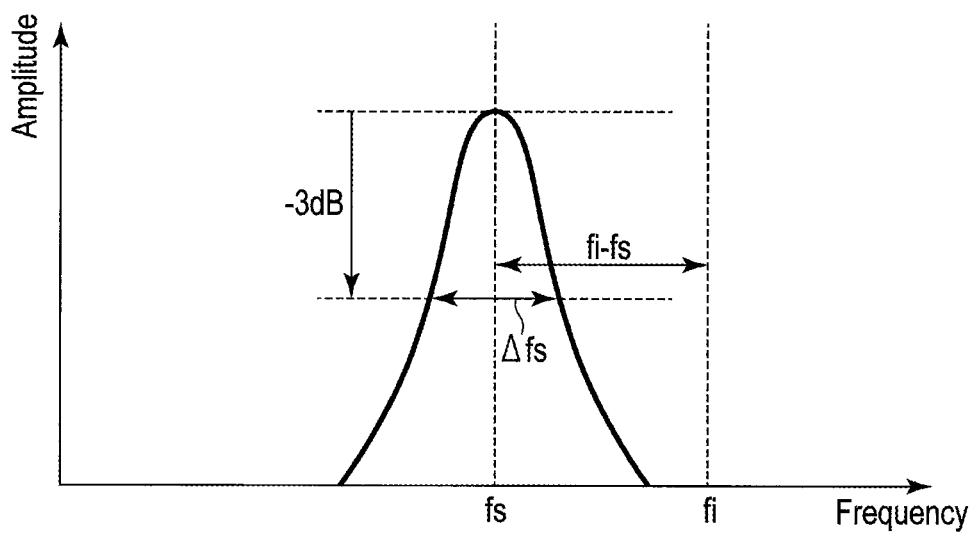
FIG. 9 is a diagram illustrating a frequency property of an amplitude of vibration based on a Coriolis force exerted on the movable unit.

FIG. 9 is a diagram illustrating the frequency property of the amplitude of the sense vibration for allowing the Coriolis force exerted on the movable unit 10 (movable portions 11 and 12) to be detected. The axis of abscissas indicates frequency, and the axis of ordinate indicates amplitude.

To substantially inhibit generation of a vibration component in the in-phase mode when the movable unit 10 is subjected to vibration based on the Coriolis force, the resonant frequency fi in the in-phase mode, a sense resonant frequency fs allowing the Coriolis force to be detected, and a half width Δfs of the frequency property of the amplitude of the sense resonance need to meet the following relation.

$fi>fs+\Delta fs/2$

The relation between Δfs and Qs is "Qs=fs/Δfs". Therefore, the expression illustrated above is represented as follows.

$fi>fs+\Delta fs/2=(1+1/(2Qs))fs$

If a plurality of sense resonant frequencies is present in a multi-axis gyrosensor, the expressions illustrated above need to hold true for the highest resonant frequency.

When the relational expressions illustrated above are represented using the above-described parameters, the following relation holds true.

$$\frac{1}{2\sqrt{2}\,\pi}\sqrt{(a_1 + a_2 + p_1 + p_2 + K_1 + K_2) + r_K} > \left(1 + \frac{1}{2Q_S}\right) f_S$$

As described above, the above-described condition 1 and condition 2 need to hold true and desirably the above-described condition 3 needs to hold true in order to suppress the vibration component in the in-phase mode in the vibration device comprising the CR mechanism and the TF mechanism.

FIG. 10 is a diagram schematically depicting a third specific configuration example of the vibration device according to the present embodiment. A basic configuration in FIG. 10 is similar to the configuration depicted in FIG. 3, and components corresponding to the components depicted in FIG. 3 are denoted by the same reference numerals. Components in FIG. 10 corresponding to the components of the first specific configuration example depicted in FIG. 5 are denoted by the same reference numerals and detailed description of these components is omitted.

In the configuration example, the second movable unit 40 comprises the third movable portion 41 and the fourth movable portion 42 which are arrayed in a direction parallel to the y axis (second axis) and which can vibrate in the direction parallel to the y axis (second axis). The third and fourth movable portions 41 and 42 may have the same configuration as that of the first and second movable portions 11 and 12 or may have a configuration different from the configuration of the first and second movable portions 11 and 12. In the configuration example, the third and fourth movable portions 41 and 42 have the same configuration as that of the first and second movable portions 11 and 12.

The connection unit 50 comprises the first connection portion 51 which connects the first movable portion 11 and the third movable portion 41 together, the second connection portion 52 which connects the second movable portion 12 and the third movable portion 41 together, the third connection portion 53 which connects the first movable portion 11 and the fourth movable portion 42 together, and the fourth connection portion 54 which connects the second movable portion 12 and the fourth movable portion 42 together.

The vibration device depicted in FIG. 10 is provided with the third fixed portion 71, a fourth fixed portion 72, the third spring portion 61 which connects the third movable portion 41 to the third fixed portion 71, and a fourth spring portion 62 which connects the fourth movable portion 42 to the fourth fixed portion 72. Each of the third and fourth spring portions 61 and 62 comprises four springs, and each of the third and fourth fixed portions 71 and 72 comprises four anchors.

The present configuration example can produce effects similar to the effects of the first specific configuration example depicted in FIG. 5.

In the present configuration example, the connection portions 51, 52, 53, and 54 may have a connection portion configuration similar to the connection portion configuration in the second specific configuration example depicted in FIG. 6.

As described above, the vibration device of the present embodiment allows the vibration component in the in-phase mode to be effectively suppressed. Thus, in the vibration device comprising the TF mechanism and the CR mechanism, the vibration component in the in-phase mode can be suppressed particularly in the initial stage of vibration. This allows a vibration device with excellent properties to be provided. Therefore, application of the vibration device of the present embodiment to a gyrosensor enables an accurate gyrosensor to be implemented.

Embodiment 2

Now, a vibration device according to a second embodiment will be described. The vibration device according to the present embodiment also comprises a tuning fork mechanism (TF mechanism) and a catch and release mechanism (CR mechanism), and is formed on a semiconductor substrate using the MEMS technique. Basic matters for the second embodiment are similar to the basic matters for the first embodiment, and thus, description of the matters described in the first embodiment is omitted. The vibration device according to the present embodiment meets the condition 1 and the condition 2 described in the first embodiment and also meets a condition 4 (described below) corresponding to the condition 3.

In the above-described first embodiment relates mainly to the principle configuration of the vibration device. However, the present embodiment relates to a gyrosensor comprising a vibration device based on the principle described in the first embodiment.

FIG. 11 is a diagram schematically depicting a configuration of the vibration device (the vibration device comprising the TF mechanism and the CR mechanism) according to the present embodiment.

A first movable portion (mass portion) 111 and a second movable portion (mass portion) 112 are arrayed in the direction parallel to the x axis (first axis) and can vibrate in the direction parallel to the x axis (first axis). A third movable portion (mass portion) 113 and a fourth movable portion (mass portion) 114 are arrayed in a direction parallel to the y axis (second axis) perpendicular to the x axis and can vibrate in the direction parallel to the y axis (second axis). As is the case with the first embodiment, the first movable portion 111 and the second movable portion 112 are included in the first movable unit, and the third movable portion 113 and the fourth movable portion 114 are included in the second movable unit.

The first movable portion 111 and the third movable portion 113 are connected together by a first connection portion 121, the second movable portion 112 and the third movable portion 113 are connected together by a second connection portion 122, the first movable portion 111 and the fourth movable portion 114 are connected together by a third connection portion 123, and the second movable portion 112 and the fourth movable portion 114 are connected together by a fourth connection portion 124. The first, second, third, and fourth connection portions 121, 122, 123, and 124 are fixed by anchors 121a, 122a, 123a, and 124a, respectively. The first, second, third, and fourth connection portions 121, 122, 123, and 124 are included in a connection unit. In the present embodiment, the connection portions (121, 122, 123, and 124) and the anchors (121a, 122a, 123a, and 124a) fulfill functions substantially similar to the functions of the connection portions (51, 52, 53, and 54) and spring portions (21, 22, 61, and 62) of the first embodiment.

In addition to the movable portions 111 and 112, electrode portions (131a, 131b, 132a, and 132b) and catch portions (141a, 141b, 142a, and 142b) are arrayed on the x axis. Similarly, in addition to the movable portions 113 and 114, electrode portions (133a, 133b, 134a, and 134b) and catch portions (143a, 143b, 144a, and 144b) are arrayed on the y axis. The catch portions (141a, 141b, 142a, and 142b) and the catch portions (143a, 143b, 144a, and 144b) are included in a catch and release mechanism.

The catch and release mechanism has a function to catch the first movable unit (movable portions 111 and 112) and the second movable unit (movable portions 113 and 114) which are vibrating and to release the first movable unit and the second movable unit which have been caught to allow the first and second movable units to start vibrating. Specifically, the catch portions (141a, 141b, 142a, 142b, 143a, 143b, 144a, and 144b) included in the catch and release mechanism each include a hold electrode H to which a hold voltage allowing the first and second movable units to be caught and held is applied, and stoppers S configured to inhibit the hold electrode H and a corresponding one of the movable portions (111, 112, 113, and 114) from coming into contact with each other. To catch the first and second movable units, a predetermined voltage is applied to the hold electrode H to make a voltage difference between the hold electrode H and the corresponding movable portion (one of 111, 112, 113, and 114) to allow an electrostatic attraction force to be exerted between the hold electrode H and the corresponding movable portion (one of 111, 112, 113, and 114). At this time, the stoppers S avoid contact between the hold electrode H and the corresponding movable portion (one of 111, 112, 113, and 114), and the corresponding movable portion (one of 111, 112, 113, and 114) remains in contact with the stoppers S.

Figure 12:
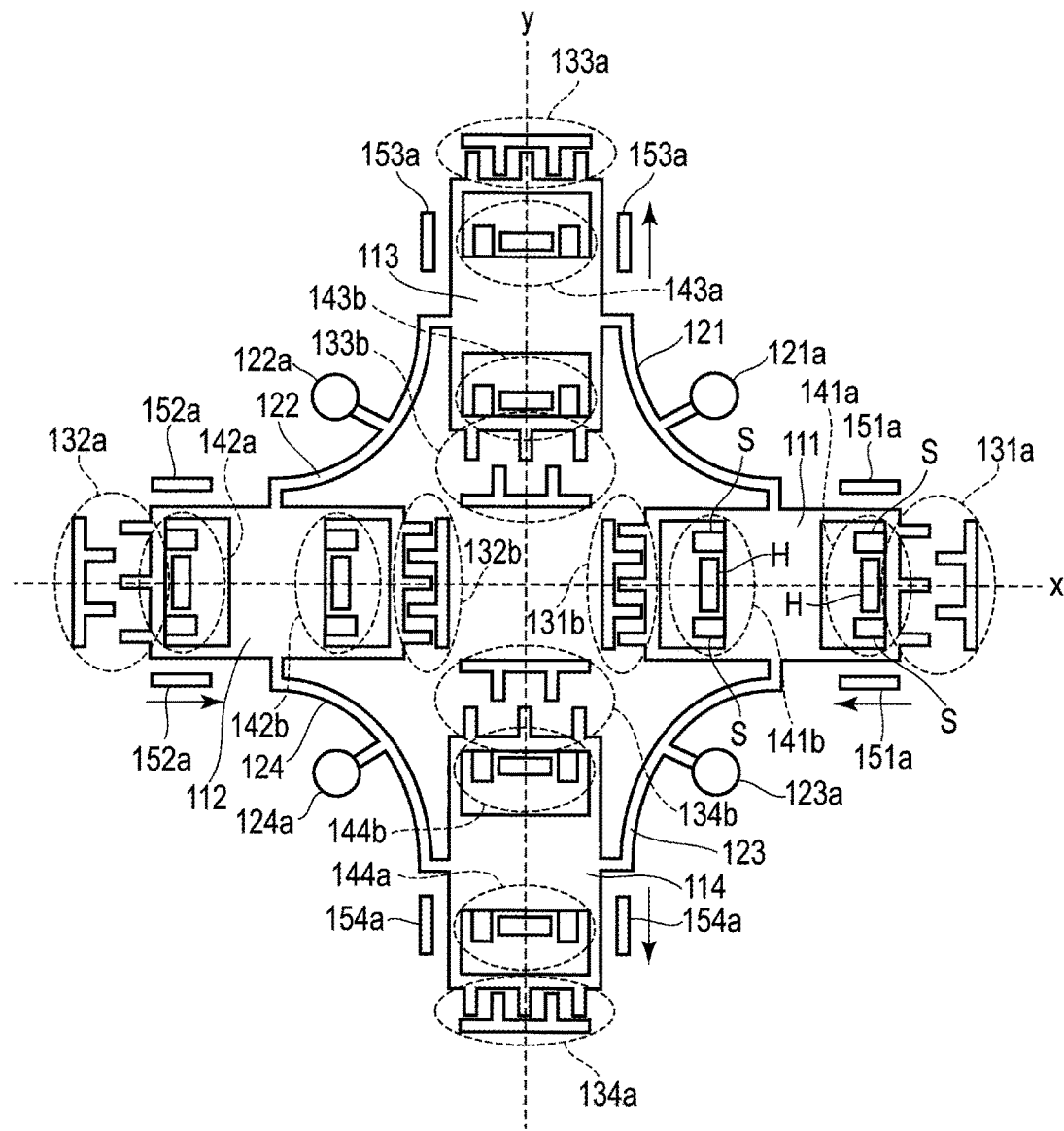
FIG. 12 is a diagram schematically illustrating that the movable unit is caught in the vibration device according to the second embodiment.

FIG. 12 schematically illustrates that the catch and release mechanism has caught the first movable unit (movable portions 111 and 112) and the second movable unit (movable portions 113 and 114). As depicted in FIG. 12, when the movable portions 111 and 112 move closer to each other and the movable portions 113 and 114 move away from each other, the first movable unit and the second movable unit are caught. The first movable unit and the second movable unit are effectively caught when the distance between the movable portions 111 and 112 is shortest and the distance between the movable portions 113 and 114 is longest.

The electrode portions (131a, 131b, 132a, 132b, 133a, 133b, 134a, and 134b) function as driving and monitoring electrodes. For the CR mechanism, a catching operation is effectively performed when vibration of the movable portion has the largest amplitude. Thus, the amplitude (the position of the movable portion) of vibration of the movable portion is monitored using the monitoring electrode. For example, monitoring the capacitance between the electrodes allows the position of the movable portion to be detected. For example, the outside electrode portions 131a and 132a on the x axis and the inside electrode portions 133b and 134b on the y axis are used as driving electrodes, and the inside electrode portions 131b and 132b on the x axis and the outside electrode portions 133a and 134a on the y axis are used as monitoring electrodes. The monitoring electrodes are also used to generate a synchronous detection signal used for a sense operation.

Figure 13:
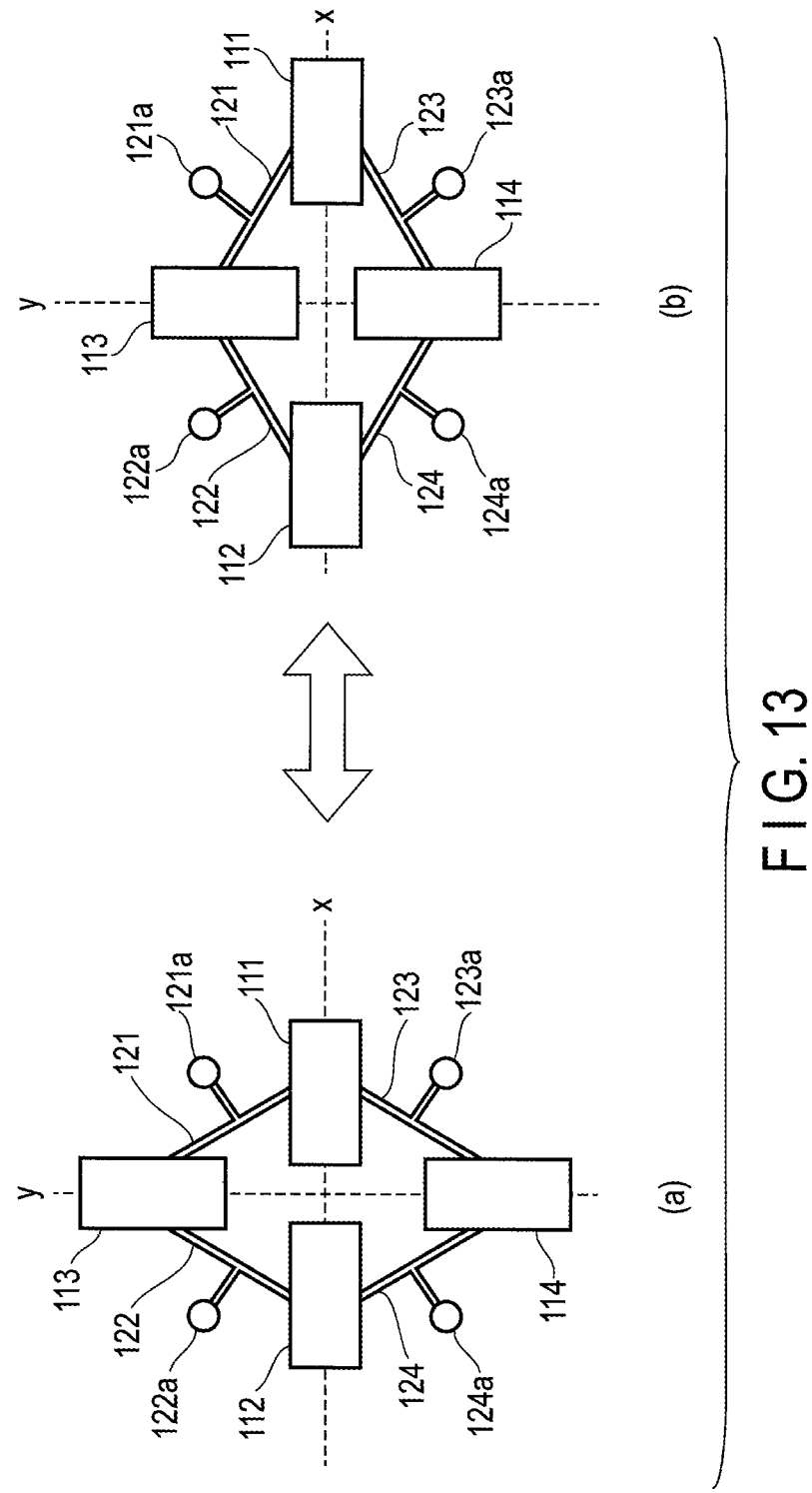
FIG. 13 is a diagram schematically illustrating a vibrating operation of the vibration device according to the second embodiment.

FIG. 13 is a diagram schematically illustrating a vibrating operation of the vibration device depicted in FIG. 11. When the first and second movable units are released from the catch and release mechanism, the first and second movable portions 111 and 112 vibrate in the direction parallel to the x axis so as to have opposite phases, and the third and fourth movable portions 113 and 114 vibrate in the direction parallel to the y axis so as to have opposite phases. That is, the first and second movable portions 111 and 112 vibrate in the opposite directions, and the third and fourth movable portions 113 and 114 vibrate in the opposite directions. When the first and second movable portions 111 and 112 move closer to each other, the third and fourth movable portions 113 and 114 move away from each other. When the first and second movable portions 111 and 112 move away from each other, the third and fourth movable portions 113 and 114 move closer to each other.

Releasing the caught movable units (movable portions 111, 112, 113, and 114) allows the movable units to start vibrating (see FIG. 13). No external force for driving is applied to the released movable unit, which thus vibrates freely. When rotary motion is applied to the movable unit which is vibrating, a Coriolis force is exerted on the movable unit. As a result, the movable unit is subjected to vibration based on the Coriolis force. The angular velocity of the movable unit can be calculated by detecting a predetermined physical quantity varying according to vibration based on the Coriolis force. In the present embodiment, capacitance is used as the predetermined physical quantity. That is, the angular velocity is calculated by detecting the capacitance varying according to the vibration based on the Coriolis force. Other examples of the predetermined physical quantity include a variation in the resistance of a piezoresistive element and generation of charge by a piezoelectric film.

The present embodiment provides a triaxial gyrosensor (angular velocity sensor) which can detect the angular velocity of rotary motion around the x axis, the angular velocity of rotary motion around the y axis, and the angular velocity of rotary motion around the z axis. Specifically, the triaxial gyrosensor of the present embodiment comprises a first detection portion which detects the predetermined physical quantity (capacitance) varying according to the vibration based on the Coriolis force resulting from a first rotation component around the x axis (first axis), a second detection portion which detects the predetermined physical quantity (capacitance) varying according to the vibration based on the Coriolis force resulting from a second rotation component around the y axis (second axis), and a third detection portion which detects the predetermined physical quantity (capacitance) varying according to the vibration based on the Coriolis force resulting from a third rotation component around the z axis (third axis).

FIG. 11 depicts third electrode portions 151a, 152a, 153a, and 154a located opposite to side surfaces of the movable portions 111, 112, 113, and 114 and used as third detection portions. The third detection portion may include a third electrode portion lying opposite to at least one of a side surface of the movable portion 111, a side surface of the movable portion 112, a side surface of the movable portion 113, and a side surface of the movable portion 114. FIG. 11 does not depict a first electrode portion and a second electrode portion used as the first and second detection portions, respectively. However, the first and second electrode portions are provided as described below. Specifically, the first detection portion includes a first electrode portion lying opposite to at least one of an upper surface of the movable portion 113, a lower surface of the movable portion 113, an upper surface of the movable portion 114, and a lower surface of the movable portion 114. The second detection portion includes a second electrode portion lying opposite to at least one of an upper surface of the movable portion 111, a lower surface of the movable portion 111, an upper surface of the movable portion 112, and a lower surface of the movable portion 112.

Figure 14:
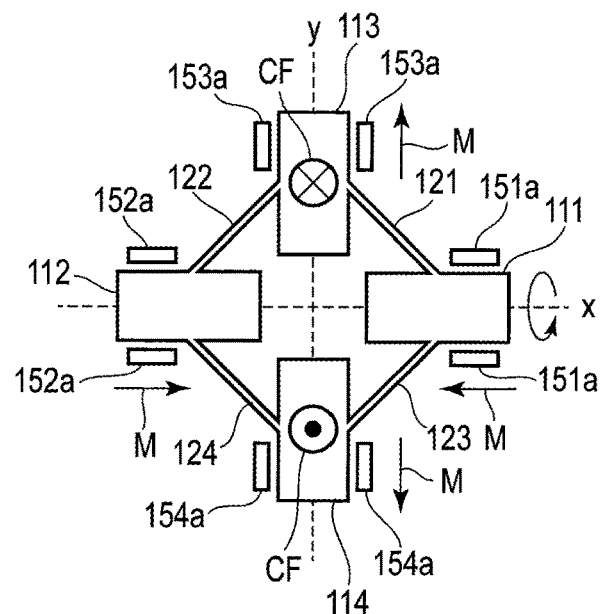
FIG. 14 is a diagram schematically illustrating a detecting operation for a predetermined physical quantity in the vibration device according to the second embodiment.

FIG. 14 is a diagram schematically illustrating a detecting operation for the predetermined physical quantity (capacitance) based on the first rotation component around the x axis. Each of the movable portions 111, 112, 113, and 114 is assumed to be moving in the direction of arrow M while vibrating. At this time, when rotary motion is applied to the movable portions 111, 112, 113, and 114, a Coriolis force CF in the z axis direction is exerted on the movable portions 113 and 114 by the first rotation component around the x axis. Thus, the first electrode portion (first detection portion) is provided near the lower surface or the upper surface of each of the movable portions 113 and 114 to detect a variation in capacitance between the movable portion and the electrode portion to allow the angular velocity of the rotation around the x axis to be calculated.

Figure 15:
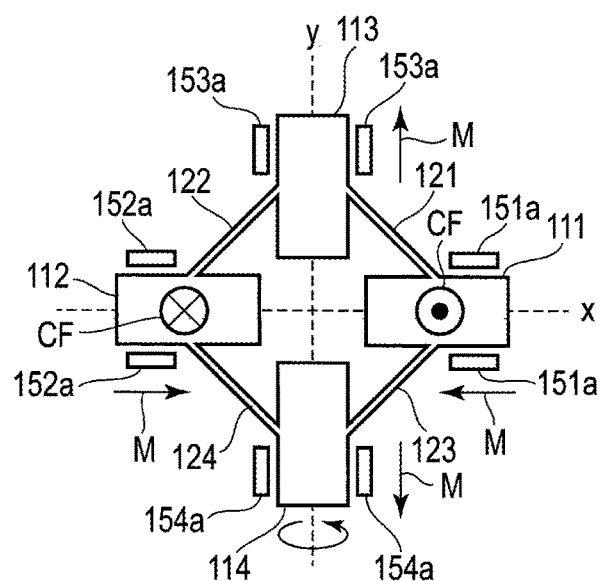
FIG. 15 is a diagram schematically illustrating a detecting operation for the predetermined physical quantity in the vibration device according to the second embodiment.

FIG. 15 is a diagram schematically illustrating a detecting operation for the predetermined physical quantity (capacitance) based on the second rotation component around the y axis. Each of the movable portions 111, 112, 113, and 114 is assumed to be moving in the direction of arrow M while vibrating. At this time, when rotary motion is applied to the movable portions 111, 112, 113, and 114, a Coriolis force CF in the z axis direction is exerted on the movable portions 111 and 112 by the second rotation component around the y axis. Thus, the second electrode portion (second detection portion) is provided near the lower surface or the upper surface of each of the movable portions 111 and 112 to detect a variation in capacitance between each movable portion and the corresponding electrode portion to allow the angular velocity of the rotation around the y axis to be calculated.

FIG. 16 is a diagram schematically illustrating a detecting operation for the predetermined physical quantity (capacitance) based on the third rotation component around the z axis. Each of the movable portions 111, 112, 113, and 114 is assumed to be moving in the direction of arrow M while vibrating. At this time, when rotary motion is applied to the movable portions 111, 112, 113, and 114, a Coriolis force CF is exerted on the movable portions 111, 112, 113, and 114 in the direction of arrows by the third rotation component around the z axis. Thus, the third electrode portions (151a, 152a, 153a, and 154a) are provided parallel to the movable portions 111, 112, 113, and 114, respectively, to detect a variation in capacitance between each movable portion and the corresponding electrode portion to allow the angular velocity of the rotation around the z axis to be calculated.

FIG. 17 is a cross-sectional view schematically depicting a first configuration example of the above-described first detection portion (or the second detection portion). As depicted in FIG. 17, the electrode portion 151b (or 153b) and the electrode portion 152b (or 154b) are provided on a substrate 161. More specifically, the electrode portion 151b (or 153b) is provided near the lower surface of the movable portion 111 (or 113), and the electrode 152b (or 154b) is provided near the lower surface of the movable portion 112 (or 114).

FIG. 18 is a cross-sectional view schematically depicting a second configuration example of the above-described first detection portion (or the second detection portion). As depicted in FIG. 18, the electrode portion 151b (or 153b) and the electrode portion 152b (or 154b) are provided on a lower surface of a cap film 162. More specifically, the electrode portion 151b (or 153b) is provided near the upper surface of the movable portion 111 (or 113), and the electrode portion 152b (or 154b) is provided near the upper surface of the movable portion 112 (or 114).

FIG. 19 is a cross-sectional view schematically depicting a third configuration example of the above-described first detection portion (or the second detection portion). As depicted in FIG. 19, the electrode portion 151b (or 153b) and the electrode portion 152b (or 154b) are provided on the substrate 161 and on the lower surface of the cap film 162. More specifically, the electrode portion 151b (or 153b) is provided near the lower surface and the upper surface of the movable portion 111 (or 113), and the electrode portion 152b (or 154b) is provided near the lower surface and the upper surface of the movable portion 112 (or 114).

As described above, the present embodiment provides the connection unit comprising the first, second, third, and fourth connection portions 121, 122, 123, and 124, thus allowing the vibration component in the in-phase mode to be effectively suppressed, as is the case with the first embodiment. Thus, in the vibration device comprising the TF mechanism and the CR mechanism, the vibration component in the in-phase mode can be suppressed particularly in the initial stage of vibration. This allows a vibration device with excellent properties to be provided. Therefore, the present embodiment enables an accurate gyrosensor to be implemented.

Furthermore, in the present embodiment, the first, second, and third detection portions are provided to allow an accurate triaxial gyrosensor to be implemented.

FIG. 20 is a diagram schematically depicting a configuration of a first modification of the vibration device (gyrosensor) according to the present embodiment. In the modification, the catch and release mechanism (the catch portions 141a, 141b, 142a, and 142b) is provided only on the x axis and not on the y axis. Providing the catch and release mechanism on only one of the x axis and the y axis as described above is also preferred. That is, the catch and release mechanism may perform a catch and release operation on at least one of the first and second movable units.

FIG. 21 is a diagram schematically depicting a configuration of a second modification of the vibration device (gyrosensor) according to the present embodiment. In the present modification, only the outside electrode portions 131a, 132a, 133a, and 134a are provided, and the inside electrode portions 131b, 132b, 133b, and 134b (see FIG. 11) are not provided. In contrast, the outside electrode portions 131a, 132a, 133a, and 134a may be omitted, with only the inside electrode portions 131b, 132b, 133b, and 134b provided.

FIG. 22 is a diagram schematically depicting a configuration of a third modification of the vibration device (gyrosensor) according to the present embodiment. FIG. 22 does not depict the electrode portions (131a, 131b, 132a, 132b, 133a, 133b, 134a, and 134b) and the catch portions (141a, 141b, 142a, 142b, 143a, 143b, 144a, and 144b) which are illustrated in FIG. 11. However, these electrode portions and catch portions are actually provided.

In the present modification, as a connection unit, auxiliary connection portions (171 and 172) and auxiliary anchors (171a and 172a) are provided in addition to the connection portions (121, 122, 123, and 124) and the anchors (121a, 122a, 123a, and 124a). In the present embodiment, the connection portions (121, 122, 123, and 124), the anchors (121a, 122a, 123a, and 124a), the auxiliary connection portions (171 and 172), and the auxiliary anchors (171a and 172a) fulfill functions substantially similar to the functions of the connection portions (51, 52, 53, and 54) and the spring portions (21, 22, 61, and 62) of the first embodiment. In particular, the auxiliary connection portions (171 and 172), and the auxiliary anchors (171a and 172a) fulfill functions substantially similar to the functions of the spring portions (21, 22, 61, and 62) of the first embodiment.

Figure 23:
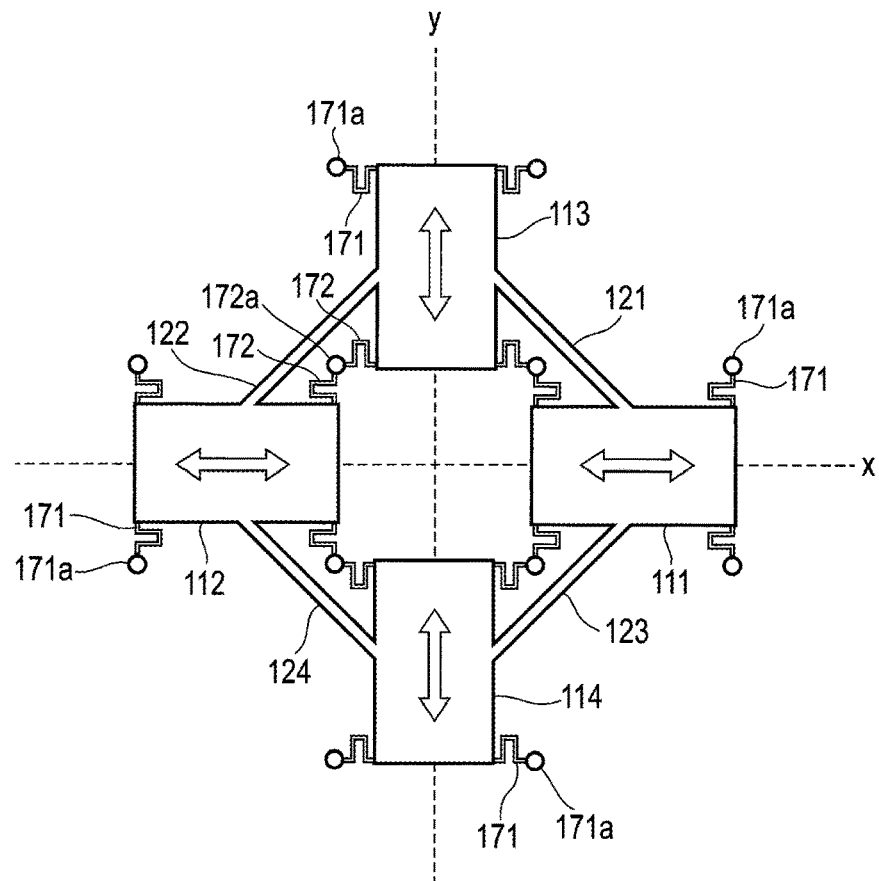
FIG. 23 is a view schematically depicting a configuration of a fourth modification of the vibration device according to the second embodiment.

FIG. 23 is a diagram schematically depicting a configuration of a fourth modification of the vibration device (gyrosensor) according to the present embodiment. A basic configuration of the fourth modification is similar to the basic configuration of the third modification (FIG. 22). However, in the present modification, the anchors 121a, 122a, 123a, and 124a are not provided. Thus, the anchors 121a, 122a, 123a, and 124a may be omitted.

Figure 24:
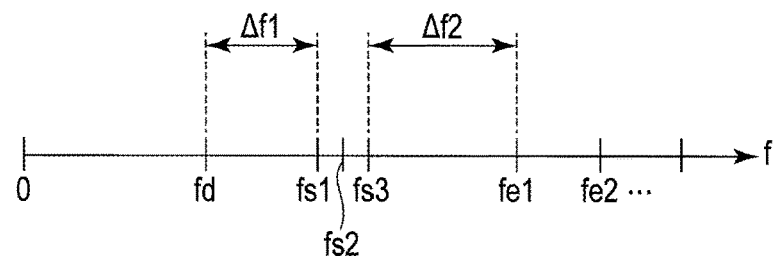
FIG. 24 is a diagram illustrating preferred conditions for the vibration device according to the second embodiment.

FIG. 24 is a diagram illustrating preferred conditions for the vibration device according to the present embodiment. The following description is given with reference to FIG. 24.

As described above, the vibration device according to the present embodiment meets the condition 1 and the condition 2 described in the first embodiment. The vibration device according to the present embodiment preferably meets a condition 4 described below, in association with the condition 3 described in the first embodiment.

The resonant frequency (first sense resonant frequency) of sense vibration for detecting a Coriolis force exerted on the first and second movable units (movable portions 111, 112, 113, and 114) by the first rotation component around the first axis (x axis) is denoted by fs1. The resonant frequency (second sense resonant frequency) of sense vibration for detecting a Coriolis force exerted on the first and second movable units by the second rotation component around the second axis (y axis) is denoted by fs2. The resonant frequency (third sense resonant frequency) of sense vibration for detecting a Coriolis force exerted on the first and second movable units by the third rotation component around the third axis (z axis) is denoted by fs3. The highest resonant frequency among the sense resonant frequencies fs1, fs2, and fs3 is denoted by fsmax. The Q factor at the highest resonant frequency fsmax is denoted by Qsmax. In this case, in the present embodiment, the following relation is preferably met.

$fi>(1+1/(2Qsmax))fsmax$

In addition to the above-described condition 4, the vibration device according to the present embodiment preferably meets following condition (condition 5).

A drive resonant frequency for the first and second movable units (movable portions 111, 112, 113, and 114) is denoted by fd. The highest frequency among the sense resonant frequencies fs1, fs2, and fs3 is denoted by fsmax. The lowest frequency among the sense resonant frequencies fs1, fs2, and fs3 is denoted by fsmin. The lowest frequency among the resonant frequencies other than the resonant frequencies fs1, fs2, fs3, and fd is denoted by femin. In FIG. 24, fs3 corresponds to fsmax, fs1 corresponds to fsmin, and fe1 corresponds to femin. A difference between the frequency fsmin and the frequency fd is denoted by Δf1. A difference between the frequency femin and the frequency fsmax is denoted by Δf2. In this case, in the present embodiment, the following relation is preferably met.

$Δf1 ≤ Δf2$

The drive resonant frequency fd and the sense resonant frequencies fs1, fs2, and fs3 are resonant frequencies in the anti-phase mode and are actually needed frequency components. In contrast, it is undesirable that a resonant mode such as the in-phase mode is present in the vicinity of any of the above-described resonant frequencies fd, fs1, fs2, and fs3. To allow a filter with a cutoff property equivalent to Δf1 to remove unwanted frequency components equal to or higher than the frequency fe1 as illustrated in FIG. 24, the above-described relation "$Δf1 ≤ Δf2$" is preferably met.

Embodiment 3

Now, a vibration device according to a third embodiment will be described. The vibration device according to the present embodiment is also used for a gyrosensor comprising a tuning fork mechanism (TF mechanism) and a catch and release mechanism (CR mechanism), and is formed on a semiconductor substrate using the MEMS technique. Basic matters for the third embodiment are similar to the basic matters for the first embodiment, and thus, description of the matters described in the first embodiment is omitted.

FIG. 25 is a diagram schematically depicting a conceptual (principle) configuration of the vibration device according to the present embodiment.

As depicted in FIG. 25, the x axis (first axis), the y axis (second axis), and the z axis (third axis) are defined which are perpendicular to one another.

A first movable portion 211 and a second movable portion 212 are arrayed in the direction parallel to the x axis (first axis) and can vibrate in the direction parallel to the x axis (first axis). The first movable portion 211 and the second movable portion 212 are included in the first movable unit.

A third movable portion 213 and a fourth movable portion 214 are arrayed in the direction parallel to the y axis (second axis) and can vibrate in the direction parallel to the y axis (second axis). The third movable portion 213 and the fourth movable portion 214 are included in the second movable unit.

A first spring portion 221 connects the first movable portion 211 to a first fixed portion (fixed end) 231. A second spring portion 222 connects the second movable portion 212 to a second fixed portion (fixed end) 232. A third spring portion 223 connects the third movable portion 213 to a third fixed portion (fixed end) 233. A fourth spring portion 224 connects the fourth movable portion 214 to a fourth fixed portion (fixed end) 234.

The first movable portion 211 and the third movable portion 213 are connected together by a first connection portion 241. The second movable portion 212 and the third movable portion 213 are connected together by a second connection portion 242. The first movable portion 211 and the fourth movable portion 214 are connected together by a third connection portion 243. The second movable portion 212 and the fourth movable portion 214 are connected together by a fourth connection portion 244. The first, second, third, and fourth connection portions 241, 242, 243, and 244 have the structure as described in the first and second embodiments. Therefore, as described in the first and second embodiments, vibration in the in-phase mode can be suppressed when vibration in the anti-phase mode is caused.

The first movable portion 211, the second movable portion 212, the third movable portion 213, and the fourth movable portion 214 are coupled together by a rotation control unit 250. In the present example, the rotation control unit 250 is provided in an area enclosed by the first to fourth movable portions 211 to 214. A detailed configuration and detailed functions of the rotation control unit 250 will be described below.

The first movable portion 211 and the rotation control unit 250 are connected together by a first connection portion 261. The second movable portion 212 and the rotation control unit 250 are connected together by a second connection portion 262. The third movable portion 213 and the rotation control unit 250 are connected together by a third connection portion 263. The fourth movable portion 214 and the rotation control unit 250 are connected together by a fourth connection portion 264.

A catch and release mechanism 270 is provided near at least one of the first movable unit (comprising the first and second movable portions 211 and 212) and the second movable unit (comprising the third and fourth movable portions 213 and 214). In the present example, the catch and release mechanism 270 is provided near the third movable portion 213 and near the fourth movable portion 214. Basic functions of the catch and release mechanism 270 are similar to the basic functions in the first embodiment. The catch and release mechanism 270 catches at least one of the first and second movable units which are vibrating and releases the at least one of the first and second movable units which has been caught to allow the movable unit to start vibrating. As is the case with the first embodiment, when the first and second movable units are released, the first and second movable portions 211 and 212 move in the direction parallel to the x axis (first axis) so as to have opposite phases, and the third and fourth movable portions 213 and 214 move in the direction parallel to the y axis (second axis) so as to have opposite phases. When the first and second movable portions 211 and 212 move closer to each other, the third and fourth movable portions 213 and 214 move away from each other. When the first and second movable portions 211 and 212 move away from each other, the third and fourth movable portions 213 and 214 move closer to each other.

A detection portion 280 is provided near at least one of the first movable unit (comprising the first and second movable portions 211 and 212) and the second movable unit (comprising the third and fourth movable portions 213 and 214). In the present example, the detection portion 280 is provided near the third movable portion 213 and near the fourth movable portion 214. Basic functions of the detection portion 280 are similar to the basic functions in the first and second embodiments. That is, the detection portion 280 detects a predetermined physical quantity based on vibration of the first and second movable units resulting from a Coriolis force applied to the first and second movable units. The predetermined physical quantity is similar to the physical quantity in the first embodiment and is, for example, capacitance.

Now, the rotation control unit 250 will be described in detail.

The rotation control unit 250 has a function to rotate the first and second movable portions 211 and 212 in the same direction, rotate the third and fourth movable portions 213 and 214 in the same direction, and rotate the first and second movable portions 211 and 212 in a direction opposite to the direction in which the third and fourth movable portions 213 and 214 rotate, in a plane perpendicular to the z axis (third axis). The rotation control unit 250 further has a function to rotate the third and fourth movable portions 213 and 214 in the same direction in a plane parallel to the x axis (first axis) and rotate the first and second movable portions 211 and 212 in the same direction in a plane perpendicular to the y axis (second axis). Provision of the rotation control unit 250 with such functions allows the in-phase sense vibration component to be effectively suppressed.

The rotation control unit 250 comprises a plurality of rotation structure portions 251 and a plurality of reverse rotation structure portions 252. In the illustrated example, the rotation control unit 250 comprises seven rotation structure portions 251 and seven reverse rotation structure portions 252.

FIG. 26 is a diagram schematically depicting functions of the rotation structure portions 251 and the reverse rotation structure portions 252 in the plane perpendicular to the z axis (third axis). Each of the rotation structure portions 251 is rotatable around a support 251f thereof in the plane perpendicular to the z axis (third axis). Each of the reverse rotation structure portions 252 has a function to rotate the rotation structure portions 251 connected to the respective ends of the reverse rotation structure portion 252, in opposite directions in the plane perpendicular to the z axis (third axis).

FIG. 27 is a diagram schematically illustrating functions of the rotation structure portions 251 and the reverse rotation structure portions 252 in a plane perpendicular to the x axis (first axis) or the y axis (second axis). Each of the rotation structure portions 251 is rotatable around the support 251f thereof in the plane perpendicular to the x axis (first axis) and in the plane perpendicular to the y axis (second axis). Each of the reverse rotation structure portions 252 has a function to rotate the rotation structure portions 251 connected to the respective ends of the reverse rotation structure portion 252, in opposite directions in the plane perpendicular to the x axis (first axis) and in the plane perpendicular to the y axis (second axis).

FIG. 28 is a diagram schematically illustrating operations of the rotation structure portions 251 and the reverse rotation structure portions 252 in the plane perpendicular to the x axis (first axis) or the y axis (second axis). Since the reverse rotation structure portions 252 has the function as described with reference to FIG. 27, the rotation structure portions 251 connected to the respective ends of the corresponding reverse rotation structure portion 252 rotate in the opposite directions.

FIG. 29, FIG. 30, and FIG. 31 are diagrams schematically depicting a configuration example of the rotation structure portion 251. In FIG. 29, a main body of the rotation structure portion 251 is connected to one anchor 251a provided in a central portion of the rotation structure portion 251. In FIG. 30, the main body of the rotation structure portion 251 is connected to four anchors 251a. In FIG. 31, the main body of the rotation structure portion 251 is connected to two anchors 251a.

The plurality of rotation structure portions 251 included in the rotation control unit 250 may have the same structure or different structures. Similarly, the plurality of reverse rotation structure portions 252 included in the rotation control unit 250 may have the same structure or different structures.

Figure 32:
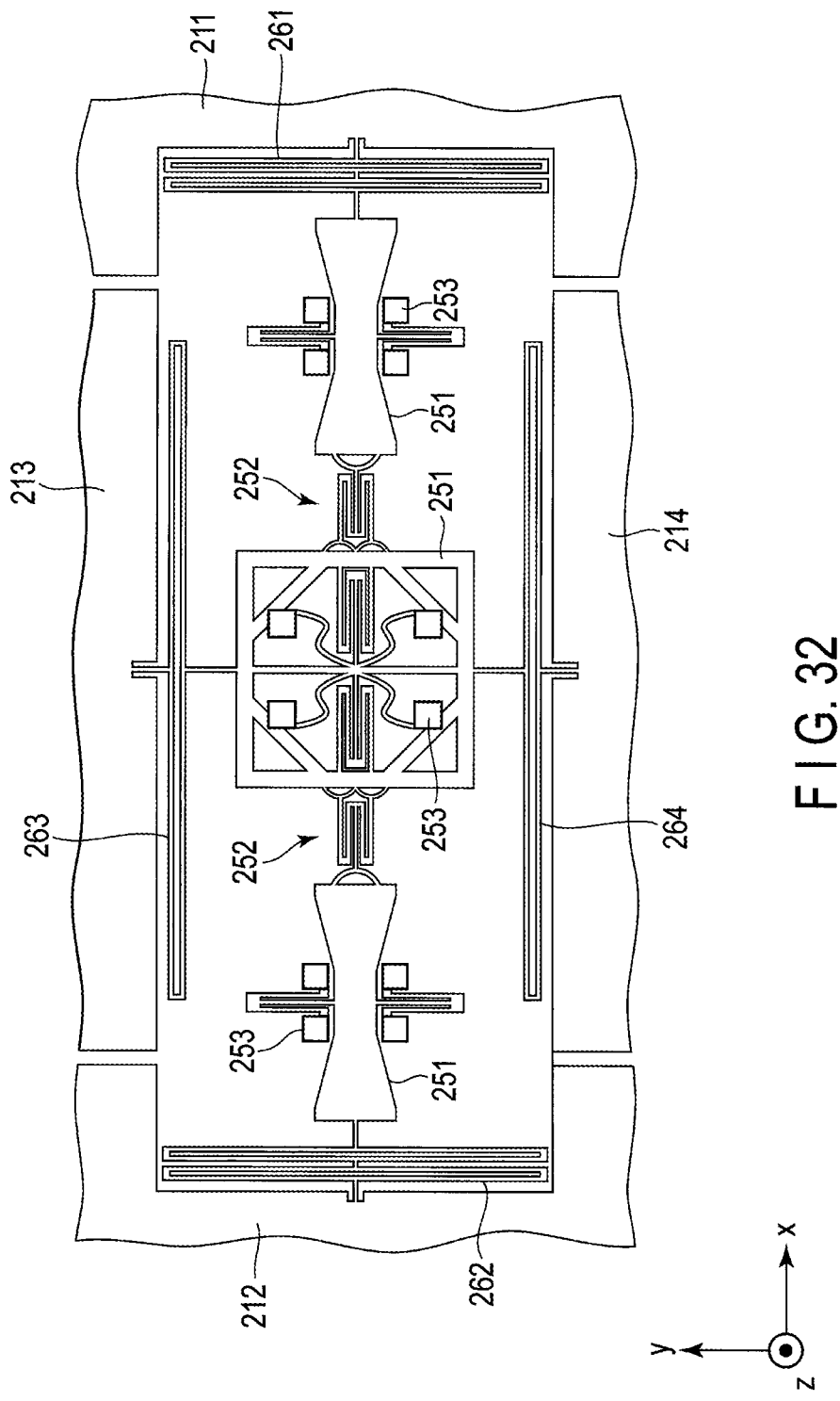
FIG. 32 is a diagram schematically depicting a specific structure of a rotation control unit in the vibration device according to the third embodiment.

FIG. 32 is a diagram schematically depicting a specific structure of the rotation control unit 250. In the present example, the rotation control unit 250 comprises three rotation structure portions 251 and two reverse rotation structure portions 252. Each of the three rotation structure portions 251 has the main body thereof held by four anchors 253. The right rotation structure portion 251 is connected to the movable portion (mass portion) 211 by a connection portion 261. The left rotation structure portion 251 is connected to the movable portion (mass portion) 212 by a connection portion 262. The central rotation structure portion 251 is connected to the movable portion (mass portion) 213 by a connection portion 263 and to the movable portion (mass portion) 214 by a connection portion 264. All of the connection portions 261, 262, 263, and 264 have a spring characteristic.

Now, a preferred condition for the reverse rotation structure portions 252 of the rotation control unit 250 will be described.

Preferably, an even number (including zero) of reverse rotation structure portions 252 are provided in any path between the first movable portion 211 and the second movable portion 212. Meeting such a condition facilitates rotation of the first movable portion 211 and the second movable portion 212 in the same direction while hindering rotation of the first movable portion 211 and the second movable portion 212 in the opposite directions. Therefore, the first movable portion 211 and the second movable portion 212 vibrate easily in the opposite directions, allowing suppression of the vibration component in the in-phase mode in the first movable portion 211 and the second movable portion 212. In the example illustrated in FIG. 25, a path provided with four reverse rotation structure portions 252 and a path provided with six reverse rotation structure portions 252 are present between the first movable portion 211 and the second movable portion 212.

Preferably, any path between the third movable portion 213 and the fourth movable portion 214 is provided with an even number (including zero) of reverse rotation structure portions 252. Meeting such a condition facilitates rotation of the third movable portion 213 and the fourth movable portion 214 in the same direction while hindering rotation of the third movable portion 213 and the fourth movable portion 214 in the opposite directions. Therefore, the third movable portion 213 and the fourth movable portion 214 vibrate easily in the opposite directions, allowing suppression of the vibration component in the in-phase mode in the third movable portion 213 and the fourth movable portion 214. In the example illustrated in FIG. 25, two paths each provided with two reverse rotation structure portions 252 are present between the third movable portion 213 and the fourth movable portion 214.

Preferably, an odd number of reverse rotation structure portions 252 are provided in any path between the first movable portion 211 and the third movable portion 213, an odd number of reverse rotation structure portions 252 are provided in any path between the second movable portion 212 and the third movable portion 213, an odd number of reverse rotation structure portions 252 are provided in any path between the first movable portion 211 and the fourth movable portion 214, and an odd number of reverse rotation structure portions 252 are provided in any path between the second movable portion 212 and the fourth movable portion 214. Meeting such a condition hinders rotation of the adjacent movable portions (the movable portions 211 and 213, the movable portions 212 and 213, the movable portions 211 and 214, and the movable portions 212 and 214) in the same direction. Therefore, the vibration component in the in-phase mode can be suppressed in the first, second, third, and fourth movable portions 211, 212, 213, and 214. In the example illustrated in FIG. 25, two paths each provided with five reverse rotation structure portions 252 are present between the first movable portion 211 and the third movable portion 213. A path provided with one reverse rotation structure portion 252 and a path provided with three reverse rotation structure portions 252 are present between the second movable portion 212 and the third movable portion 213. A path provided with three reverse rotation structure portions 252 and a path provided with seven reverse rotation structure portions 252 are present between the first movable portion 211 and the fourth movable portion 214. A path provided with one reverse rotation structure portion 252 and a path provided with three reverse rotation structure portions 252 are present between the second movable portion 212 and the fourth movable portion 214.

As described above, in the vibration device of the present embodiment, the rotation control unit 250 is provided to allow the in-phase sense vibration component to be effectively suppressed. Thus, in the vibration device comprising the TF mechanism and the CR mechanism, the vibration component in the in-phase mode can be suppressed particularly in the initial stage of vibration. This allows a vibration device with excellent properties to be provided. Therefore, application of the vibration device of the present embodiment to a gyrosensor enables an accurate gyrosensor, particularly an accurate triaxial (the x axis, the y axis, and the z axis) gyrosensor to be implemented.

Embodiment 4

Now, a vibration device according to a fourth embodiment will be described. The vibration device according to the present embodiment is also used for a gyrosensor comprising a tuning fork mechanism (TF mechanism) and a catch and release mechanism (CR mechanism), and is formed on a semiconductor substrate using the MEMS technique. Basic matters for the fourth embodiment are similar to the basic matters for the first embodiment and the like, and thus, description of the matters described in the first embodiment is omitted.

As described above, in the vibration device comprising the TF mechanism and the CR mechanism, a difference in spring constant between springs or an incorrect release timing causes vibration in the in-phase mode to be inevitably mixed in spite of an attempt to induce only vibration in the anti-phase mode. In the present embodiment, the vibration in the in-phase mode is suppressed as follows.

FIG. 33 and FIG. 34 are diagrams schematically depicting a conceptual (principle) configuration of the vibration device according to the present embodiment. FIG. 33 is a diagram schematically illustrating a catch state where the movable portions are caught. FIG. 34 is a diagram schematically illustrating a release state where the movable portions are released.

The vibration device of the present embodiment comprises movable portions (mass portions) 311, 312, and 313. The mass of the movable portion 311 is sufficiently large compared to the mass of the movable portion 312. The mass of the movable portion 312 is the same as the mass of the movable portion 313.

The movable portion 311 is connected to fixed portions 331a and 331b by spring portions 321a and 321b, respectively. The movable portion 312 is connected to a fixed portion 332 by a spring portion 322. The movable portion 313 is connected to a fixed portion 333 by a spring portion 323. The movable portion 311 and the movable portion 312 are connected together by a connection portion 342. The movable portion 311 and the movable portion 313 are connected together by a connection portion 343.

A catch and release mechanism 350 is provided near the movable portion 311. As is the case with the first embodiment, the catch and release mechanism 350 performs a catch and release operation on the movable portion 311. That is, vibration of the movable portion 311 is started by shifting the movable portion 311 from the catch state to the release state.

Since the movable portions 312 and 313 are connected to the movable portion 311 via the connection portions 342 and 343, starting vibration of the movable portion 311 allows the movable portions 312 and 313 to start vibrating. Specifically, when the movable portion 311 vibrates in a y direction, the movable portions 312 and 313 vibrate in an x direction perpendicular to the y direction. The movable portions 312 and 313 are provided on the respective sides of the movable portion 311 and thus vibrate so as to have opposite phases.

Since the mass of the movable portion 311 is sufficiently large compared to each of the masses of the movable portions 312 and 313, vibration of the movable portions 312 and 313 is substantially controlled by vibration of the movable portion 311. That is, when the movable portion 311 is released by the catch and release mechanism 350 to start vibrating, the movable portions 312 and 313 start vibrating at the same timing so as to have opposite phases.

FIG. 35 is a diagram schematically depicting a configuration of a gyrosensor using the basic principle of the above-described vibration device.

As described above, the mass of the movable portion 311 is sufficiently large compared to each of the mass of the movable portion 312 and the mass of the movable portion 313, and the mass of the movable portion 312 is the same as the mass of the movable portion 313.

The movable portion 311 is connected to the fixed portions 331a and 331b by the spring portions 321a and 321b, respectively. The movable portion 312 is connected to the fixed portion 332 by the spring portion 322. The movable portion 313 is connected to the fixed portion 333 by the spring portion 323. The movable portion 311 and the movable portion 312 are connected together by the connection portion 342. The movable portion 311 and the movable portion 313 are connected together by the connection portion 343.

The catch and release mechanism 350 is provided inside the movable portion 311. The catch and release mechanism 350 comprises a hold electrode 351 and stoppers 352. The catch and release mechanism 350 is as described above.

Drive electrodes 361a and 361b are provided above and below the movable portion 311, respectively. A detection electrode 372 is provided inside the movable portion 312. A detection electrode 373 is provided inside the movable portion 313. The detection electrodes 372 and 373 are included in a detection portion for the capacitance varying according to the Coriolis force as is the case with the above-described embodiments.

FIG. 36 is a diagram schematically depicting a specific configuration of the connection portion 342 depicted in FIG. 35. The connection portion depicted in FIG. 35 has a similar specific configuration. The connection portion 342 depicted in FIG. 36 comprises anchors 342a and movable structure portions 342b. Opposite ends of each of the movable structure portions 342b are connected to the movable portion 311 and the movable portion 312, respectively.

FIG. 37 is a diagram schematically illustrating the state of the connection portion 342 during vibration of the movable portions 311 and 312. When the movable portion 311 vibrates (moves) in the direction of an arrow (y axis direction), the movable structure portion 342b rotates around the anchor 342a. As a result, the movable portion 312 vibrates (moves) in the direction of an arrow (x axis direction). Similarly, the movable portion 313 depicted in FIG. 35 vibrates (moves) in the x axis direction. As seen in FIG. 35 and FIG. 36, the movable portions 312 and 313 move in the opposite directions, leading to vibration in the anti-phase mode.

As described above, in the vibration device of the present embodiment, the catch and release mechanism 350 is provided only for the movable portion 311 having a sufficiently large mass compared to each of the movable portions 312 and 313. Thus, a vibration start timing for the movable portions 312 and 313 is controlled simply by a release timing (vibration start timing) for the movable portion 311. Therefore, anti-phase vibration of the movable portions 312 and 313 can be started at the same timing. As a result, the vibration component in the in-phase mode can be suppressed particularly in the initial stage of vibration, allowing a vibration device with excellent properties to be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A vibration device comprising:
    a first movable unit including a first movable portion and a second movable portion arranged in a direction parallel to a first axis and enabled to vibrate in the direction parallel to the first axis;
    a second movable unit enabled to vibrate in a direction parallel to a second axis perpendicular to the first axis;
    a connection unit configured to connect the first movable unit and the second movable unit together, wherein
    the following relationship is satisfied:

$$fi > (1 + 1/(2Qa))fa$$

where a resonant frequency of the first movable unit in an in-phase mode is denoted by fi, a resonant frequency of the first movable unit in an anti-phase mode is denoted by fa, and a Q factor of resonance of the first movable unit in the anti-phase mode is denoted by Qa, and
    wherein the following relationship is satisfied:

$$fi > (1 + 1/(2Qs))fs$$

where a resonant frequency of sense vibration of the first movable unit for detecting a Coriolis force applied to the first movable unit and a Q factor of resonance are denoted by fs and Qs, respectively.

2. The vibration device according to claim 1, further comprising:
    a catch and release mechanism configured to catch the first movable unit which is vibrating and to release the caught first movable unit to allow vibration, wherein
    the first movable unit is released to allow the first and second movable portions to vibrate in the direction parallel to the first axis so as to have anti-phase vibration.

3. The vibration device according to claim 1, further comprising:
    a detection portion configured to detect a predetermined physical quantity varying according to vibration of the first movable unit based on a Coriolis force applied to the first movable unit.

4. The vibration device according to claim 1, wherein
    the second movable unit includes a third movable portion enabled to vibrate in the direction parallel to the second axis, and
    the connection unit includes a first connection portion connecting the first movable portion and the third movable portion together and a second connection portion connecting the second movable portion and the third movable portion together.

5. The vibration device according to claim 4, wherein
    each of the first and second connection portions has an invariable length.

6. The vibration device according to claim 4, wherein each of the first and second connection portions is rotatable around a support thereof.

7. The vibration device according to claim 1, wherein
the second movable unit comprises a third movable portion and a fourth movable portion arranged in the direction parallel to the second axis and enabled to vibrate in the direction parallel to the second axis, and
the connection unit includes a first connection portion connecting the first movable portion and the third movable portion together, a second connection portion connecting the second movable portion and the third movable portion together, a third connection portion connecting the first movable portion and the fourth movable portion together, and a fourth connection portion connecting the second movable portion and the fourth movable portion together.

8. The vibration device according to claim 7, further comprising:
a catch and release mechanism configured to catch at least one of the first and second movable units which are vibrating and to release the at least one of the first and second movable units which has been caught to allow vibration, wherein
the at least one of the first and second movable units is released to allow the first and second movable portions to vibrate in the direction parallel to the first axis so as to have anti-phase vibration, and to allow the third and fourth movable portions to vibrate in the direction parallel to the second axis so as to have anti-phase vibration, and
when the first and second movable portions move closer to each other, the third and fourth movable portions move away from each other, and when the first and second movable portions move away from each other, the third and fourth movable portions move closer to each other.

9. The vibration device according to claim 8, wherein
the catch and release mechanism catches the at least one of the first and second movable units such that the first and second movable portions are located close to each other while the third and fourth movable portions are located away from each other.

10. The vibration device according to claim 7, wherein the following relationship is satisfied:

$fi > (1 + 1/(2Q_{smax}))f_{smax}$ where an axis perpendicular to both the first axis and the second axis is designated as a third axis, a resonant frequency of sense vibration for detecting a Coriolis force exerted on the first and second movable units by a first rotation component around the first axis is denoted by fs1, a resonant frequency of sense vibration for detecting a Coriolis force exerted on the first and second movable units by a second rotation component around the second axis is denoted by fs2, a resonant frequency of sense vibration for detecting a Coriolis force exerted on the first and second movable units by a third rotation component around the third axis is denoted by fs3, a highest resonant frequency among the resonant frequencies fs1, fs2, and fs3 is denoted by fsmax, and a Q factor at the highest resonant frequency fsmax is denoted by Qsmax.

11. The vibration device according to claim 7, further comprising:
a first detection portion configured to detect a predetermined physical quantity varying according to vibration based on a Coriolis force exerted on the first and second movable units by a first rotation component around the first axis;
a second detection portion configured to detect a predetermined physical quantity varying according to vibration based on a Coriolis force exerted on the first and second movable units by a second rotation component around the second axis; and
a third detection portion configured to detect a predetermined physical quantity varying according to vibration based on a Coriolis force exerted on the first and second movable units by a third rotation component around a third axis which is an axis perpendicular to both the first axis and the second axis.

12. The vibration device according to claim 11, wherein
the first detection portion includes a mechanism configured to enable detection of displacement of the third and fourth movable portions in a direction parallel to the third axis,
the second detection portion includes a mechanism configured to enable detection of displacement of the first and second movable portions in the direction parallel to the third axis, and
the third detection portion includes a mechanism configured to enable detection of displacement of the first and second movable portions in the direction parallel to the second axis and a mechanism configured to enable detection of displacement of the third and fourth movable portions in the direction parallel to the first axis.

13. The vibration device according to claim 11, wherein
the first detection portion includes a first electrode portion facing at least one of an upper surface of the third movable portion, a lower surface of the third movable portion, an upper surface of the fourth movable portion, and a lower surface of the fourth movable portion, and
the second detection portion includes a second electrode portion facing at least one of an upper surface of the first movable portion, a lower surface of the first movable portion, an upper surface of the second movable portion, and a lower surface of the second movable portion.

* * * * *